United States Patent
Matsueda

(10) Patent No.: US 11,244,984 B2
(45) Date of Patent: Feb. 8, 2022

(54) DISPLAY DEVICE WITH FIRST DELTA SUBPIXEL ARRANGEMENT AND SECOND DELTA SUBPIXEL ARRANGEMENT DISPOSED ALONG FIRST AND SECOND AXES AND CONFIGURED TO DETERMINE LUMINANCE VALUES TO BE ASSIGNED TO SUBPIXELS AND METHOD OF CONTROLLING THE SAME

(71) Applicant: Tianma Japan, Ltd., Kanagawa (JP)

(72) Inventor: Yojiro Matsueda, Kanagawa (JP)

(73) Assignees: WUHAN TIANMA MICRO-ELECTRONICS CO., LTD., Wuhan (CN); TIANMA JAPAN, LTD., Kanagawa (JP)

( * ) Notice: Subject to any disclaimer, the term of this patent is extended or adjusted under 35 U.S.C. 154(b) by 0 days.

(21) Appl. No.: 16/561,495

(22) Filed: Sep. 5, 2019

(65) Prior Publication Data

US 2020/0075689 A1    Mar. 5, 2020

(30) Foreign Application Priority Data

Sep. 5, 2018  (JP) .............................. JP2018-165820

(51) Int. Cl.
   *G09G 3/3208* (2016.01)
   *H01L 27/32* (2006.01)
   *G09G 3/3291* (2016.01)
   *G09G 3/3283* (2016.01)

(52) U.S. Cl.
   CPC ....... *H01L 27/3218* (2013.01); *G09G 3/3283* (2013.01); *G09G 3/3291* (2013.01)

(58) Field of Classification Search
   None
   See application file for complete search history.

(56) References Cited

U.S. PATENT DOCUMENTS

| | | | |
|---|---|---|---|
| 2010/0315319 A1* | 12/2010 | Cok | G09G 3/20 345/77 |
| 2013/0106891 A1* | 5/2013 | Matsueda | G09G 3/2074 345/589 |
| 2016/0277722 A1* | 9/2016 | Guo | H04N 13/31 |
| 2017/0025052 A1* | 1/2017 | Lin | G09G 3/2003 |
| 2017/0178554 A1 | 6/2017 | Xiao | |
| 2020/0066219 A1* | 2/2020 | Hsu | G09G 3/006 |

* cited by examiner

*Primary Examiner* — Amr A Awad
*Assistant Examiner* — Donna V Bocar
(74) *Attorney, Agent, or Firm* — Nixon & Vanderhye

(57) ABSTRACT

For the first type of display pixel, a display device determines a luminance value assigned from a first frame pixel to the green subpixel, a luminance value assigned from the first frame pixel to each of the two red subpixels to be a value lower than a luminance value for one red subpixel, and a luminance value assigned from the first frame pixel to each of the two blue subpixels to be a value lower than a luminance value for one blue subpixel. For the second type of display pixel, the display device determines a luminance value assigned from a second frame pixel to each of the red subpixel and the blue subpixel, and a luminance value assigned from the second frame pixel to each of the two green subpixels to be a value lower than a luminance value determined for one green subpixel.

9 Claims, 13 Drawing Sheets

DISPLAY DEVICE WITH FIRST DELTA SUBPIXEL ARRANGEMENT AND SECOND DELTA SUBPIXEL ARRANGEMENT DISPOSED ALONG FIRST AND SECOND AXES AND CONFIGURED TO DETERMINE LUMINANCE VALUES TO BE ASSIGNED TO SUBPIXELS AND METHOD OF CONTROLLING THE SAME

CROSS-REFERENCE TO RELATED APPLICATIONS

This Non-provisional application claims priority under 35 U.S.C. § 119(a) on Patent Application No. 2018-165820 filed in Japan on Sep. 5, 2018, the entire content of which is hereby incorporated by reference.

BACKGROUND

This disclosure relates to a display device and a method of controlling the same.

The display region of a color display device is generally composed of red (R) subpixels, green (G) subpixels, and blue (B) subpixels arrayed on the substrate of a display panel. Various arrangements of subpixels (pixel arrangements) have been proposed; for example, RGB stripe arrangement and delta-nabla arrangement (also simply referred to as delta arrangement) have been known.

SUMMARY

An aspect of this disclosure is a display device including: a display panel; and a control device configured to control the display panel. A display region of the display panel includes a plurality of subpixel rows each extending along a first axis. The plurality of subpixel rows include red subpixel rows composed of red subpixels, blue subpixel rows composed of blue subpixels, and green subpixel rows composed of green subpixels, the red subpixel rows, the blue subpixel rows and the green subpixel rows being cyclically disposed one above another. Subpixel rows adjacent to each other in the plurality of subpixel rows are located at different positions along the first axis. The display region includes (2n+1) subpixel columns each extending along a second axis perpendicular to the first axis, where n is a natural number. Each of the plurality of subpixel columns is composed of red subpixels, green subpixels, and blue subpixels cyclically disposed one above another. The control device is configured to determine luminance data for each of first type of display pixels and second type of display pixels in the display region from luminance data for each frame pixel included in a video frame. Each of the first type of display pixels consists of: one green subpixel; two red subpixels included in a red subpixel row adjacent to a green subpixel row including the one green subpixel, each of the two red subpixels being included in a different subpixel column adjacent to a subpixel column including the one green subpixel; and two blue subpixels included in a blue subpixel row adjacent to the green subpixel row including the one green subpixel, each of the two blue subpixels being included in the different subpixel column adjacent to the subpixel column including the one green subpixel. Each of the second type of display pixels consists of: two green subpixels adjacent to each other in one green subpixel row; one red subpixel included in a subpixel column between subpixel columns each including one of the two green subpixels and in a red subpixel row adjacent to the one green subpixel row; and one blue subpixel included in the subpixel column between the subpixel columns each including one of the two green subpixels and in a blue subpixel row adjacent to the one green subpixel row. Rows composed of first type of display pixels disposed along the first axis and rows composed of second type of display pixels disposed along the first axis are disposed alternately along the second axis in the display region. In each of the rows composed of first type of display pixels, first type of display pixels adjacent to each other share a red subpixel and a blue subpixel and each green subpixel belongs to one first type of display pixel exclusively. In each of the rows composed of second type of display pixels, second type of display pixels adjacent to each other share a green subpixel and each red subpixel and each blue subpixel belong to one second type of display pixel exclusively. The control device is configured to: determine a luminance value to be assigned from a first frame pixel to the green subpixel of a corresponding first type of display pixel based on luminance data for the first frame pixel in a predetermined method; determine a luminance value to be assigned from the first frame pixel to each of the two red subpixels of the first type of display pixel to be a value lower than a luminance value determined for one red subpixel based on the luminance data for the first frame pixel in the predetermined method; determine a luminance value to be assigned from the first frame pixel to each of the two blue subpixels of the first type of display pixel to be a value lower than a luminance value determined for one blue subpixel based on the luminance data for the first frame pixel in the predetermined method; determine a luminance value to be assigned from a second frame pixel to each of the red subpixel and the blue subpixel of a corresponding second type of display pixel based on luminance data for the second frame pixel in the predetermined method; and determine a luminance value to be assigned from the second frame pixel to each of the two green subpixels of the second type of display pixel to be a value lower than a luminance value determined for one green subpixel based on the luminance data for the second frame pixel in the predetermined method.

It is to be understood that both the foregoing general description and the following detailed description are exemplary and explanatory and are not restrictive of this disclosure.

EMBODIMENTS

Figure 1:
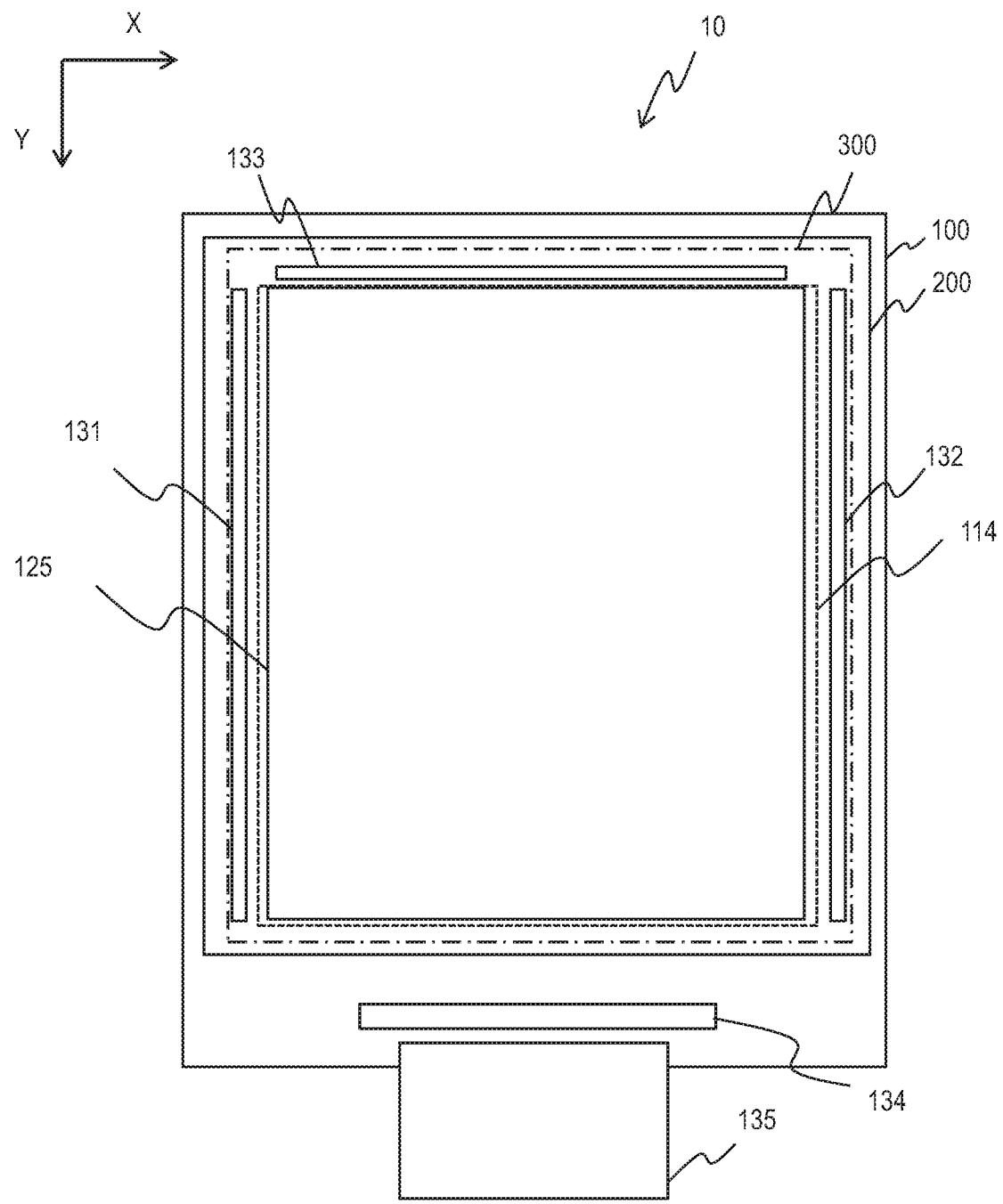
FIG. 1 schematically illustrates a configuration example of an OLED display device.

Hereinafter, embodiments of this disclosure will be described with reference to the accompanying drawings. It should be noted that the embodiments are merely examples to implement the features of this disclosure and are not to limit the technical scope of this disclosure. Elements common to the drawings are denoted by the same reference signs.

Configuration of Display Device

An overall configuration of the display device in the embodiments is described with reference to FIG. 1. The elements in the drawings may be exaggerated in size or shape for clear understanding of the description. In the following, an organic light-emitting diode (OLED) display device is described as an example of the display device; however, the features of this disclosure are applicable to any type of display device other than the OLED display device, such as liquid crystal display device or micro LED display device.

FIG. 1 schematically illustrates a configuration example of an OLED display device 10. The OLED display device 10 includes an OLED display panel and a control device. The OLED display panel includes a thin film transistor (TFT) substrate 100 on which OLED elements (light-emitting elements) are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, a protection circuit 133, and a driver IC 134 are provided. These are connected to the external devices via flexible printed circuits (FPC) 135. The driver IC 134, the scanning driver 131, the emission driver 132, and the protection circuit 133 are included in the control device.

The scanning driver 131 drives scanning lines on the TFT substrate 100. The emission driver 132 drives emission control lines to control the light emission periods of subpixels. The protection circuit 133 protects the elements from electrostatic discharge. The driver IC 134 is mounted with an anisotropic conductive film (ACF), for example.

The driver IC 134 provides power and timing signals (control signals) to the scanning driver 131 and the emission driver 132 and further, provides signals corresponding to picture data to the data lines. In other words, the driver IC 134 has a display control function. As will be described later, the driver IC 134 has a function to convert luminance data for the pixels (frame pixels) of a video frame into luminance data for the subpixels of the display panel.

In FIG. 1, the axis extending from the left to the right is referred to as X-axis and the axis extending from the top to the bottom is referred to as Y-axis. The scanning lines extend along the X-axis. Hereinafter, the pixels or subpixels disposed in a line along the X-axis within the display region 125 are referred to as a pixel row or subpixel row; the pixels or subpixels disposed in a line along the Y-axis within the display region 125 are referred to as a pixel column or subpixel column for descriptive purposes. However, the orientations of the rows and the columns are not limited to this example.

Figure 2:
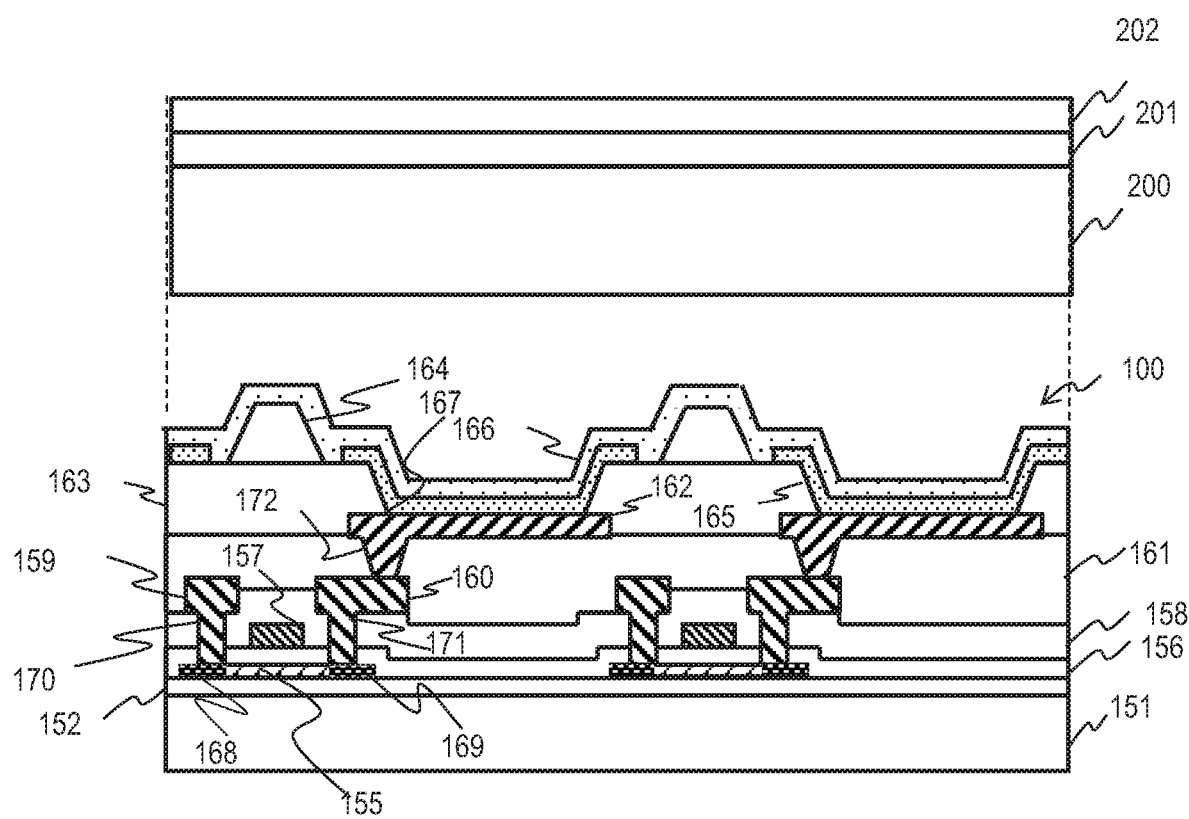
FIG. 2 illustrates an example of a pixel structure.

Next, a detailed structure of the OLED display device 10 is described. FIG. 2 schematically illustrates a part of a cross-sectional structure of the OLED display device 10, particularly the part including a driving TFT. The OLED display device 10 includes a TFT substrate 100 and a structural encapsulation unit opposed to the TFT substrate 100. The TFT substrate 100 includes an insulating substrate 151. An example of the structural encapsulation unit is a flexible or inflexible encapsulation substrate 200. The structural encapsulation unit can be a thin film encapsulation (TFE) structure, for example.

The OLED display device 10 includes lower electrodes (for example, anode electrodes 162), upper electrodes (for example, cathode electrodes 166), and organic light-emitting films 165 disposed between the insulating substrate 151 and the structural encapsulation unit. The organic light-emitting films 165 are provided between the cathode electrodes 166 and the anode electrodes 162. The plurality of anode electrodes 162 are disposed on the same plane (for example, on a planarization film 161) and an organic light-emitting film 165 is disposed on an anode electrode 162. In the example of FIG. 2, the cathode electrode 166 of one subpixel is a part of an unseparated conductor film.

The OLED display device 10 further includes a plurality of post spacers (PS) 164 standing toward the structural encapsulation unit and a plurality of pixel circuits each including a plurality of switches. Each of the plurality of pixel circuits is formed between the insulating substrate 151 and an anode electrode 162 and controls the electric current to be supplied to the anode electrode 162.

FIG. 2 illustrates an example of a top-emission pixel structure, which includes top-emission type of OLED elements. The top-emission pixel structure is configured in such a manner that a cathode electrode 166 common to a plurality of pixels is provided on the light emission side (the upper side of the drawing). The cathode electrode 166 has a shape that fully covers the entire display region 125. The top-emission pixel structure is characterized by that the anode electrodes 162 have light reflectivity and the cathode electrode 166 has light transmissivity. Hence, a configuration to transmit light coming from the organic light-emitting films 165 toward the structural encapsulation unit is attained.

Compared to a bottom-emission pixel structure configured to extract light from the insulating substrate 151, the top-emission type does not need a light transmissive region within a pixel region to extract light. For this reason, the top-emission type has high flexibility in laying out pixel circuits. For example, the light-emitting unit can be provided above the pixel circuits or lines. The bottom-emission pixel structure has a transparent anode electrode and a reflective cathode electrode to emit light to the external through the insulating substrate 151. The features of this disclosure are also applicable to an OLED display device having a bottom-emission pixel structure.

A subpixel of a full-color OLED display device usually displays one of the colors of red, green, and blue. A red subpixel, a green subpixel, and a blue subpixel constitute one main pixel. A pixel circuit including a plurality of thin film transistors controls light emission of an OLED element associated therewith. An OLED element is composed of an anode electrode of a lower electrode, an organic light-emitting film, and a cathode electrode of an upper electrode.

The insulating substrate 151 is made of glass or resin, for example, and is flexible or inflexible. A poly-silicon layer is provided above the insulating substrate 151 with a first insulating film 152 interposed therebetween. The poly-silicon layer includes channels 155 at the locations where gate electrodes 157 are to be formed later. Each channel 155 determines the transistor characteristics of the TFT. At both ends of each channel 155, a source region 168 and a drain region 169 are provided. The source region 168 and the drain region 169 are doped with high-concentration impurities for electrical connection with a wiring layer thereabove.

Lightly doped drains (LDDs) doped with low-concentration impurities can be provided between the channel 155 and the source region 168 and between the channel 155 and the drain region 169. FIG. 2 omits the LDDs to avoid complexity. Above the poly-silicon layer, gate electrodes 157 are provided with a gate insulating film 156 interposed therebetween. An interlayer insulating film 158 is provided above the layer of the gate electrodes 157.

Within the display region 125, source electrodes 159 and drain electrodes 160 are provided above the interlayer insulating film 158. The source electrodes 159 and the drain electrodes 160 are formed of a metal having a high melting point or an alloy of such a metal. Each source electrode 159 and each drain electrode 160 are connected with a source region 168 and a drain region 169 of the poly-silicon layer through contact holes 170 and 171 provided in the interlayer insulating film 158 and the gate insulating film 156.

Over the source electrodes 159 and the drain electrodes 160, an insulative planarization film 161 is provided. Above the insulative planarization film 161, anode electrodes 162 are provided. Each anode electrode 162 is connected with a drain electrode 160 through a contact provided in a contact hole 172 in the planarization film 161. The TFTs of a pixel circuit are formed below the anode electrode 162.

Above the anode electrodes 162, an insulative pixel defining layer (PDL) 163 is provided to separate OLED elements. OLED elements are formed in openings 167 of the pixel defining layer 163. Insulative spacers 164 are provided on the pixel defining layer 163 to be located between anode electrodes 162 and maintain the space between the OLED elements and the encapsulation substrate 200.

Above each anode electrode 162, an organic light-emitting film 165 is provided. The organic light-emitting film 165 is in contact with the pixel defining layer 163 in the opening 167 of the pixel defining layer 163 and its periphery. A cathode electrode 166 is provided over the organic light-emitting film 165. The cathode electrode 166 is a light-transmissive electrode. The cathode electrode 166 transmits all or part of the visible light coming from the organic light-emitting film 165. The laminated film of the anode electrode 162, the organic light-emitting film 165, and the cathode electrode 166 formed in an opening 167 of the pixel defining layer 163 corresponds to an OLED element. A not-shown cap layer may be provided over the cathode electrode 166.

The encapsulation substrate 200 is a transparent insulating substrate, which can be made of glass. A $\lambda/4$ plate 201 and a polarizing plate 202 are provided over the light emission surface (top face) of the encapsulation substrate 200 to prevent reflection of light entering from the external.

Configuration of Driver IC

Figure 3:
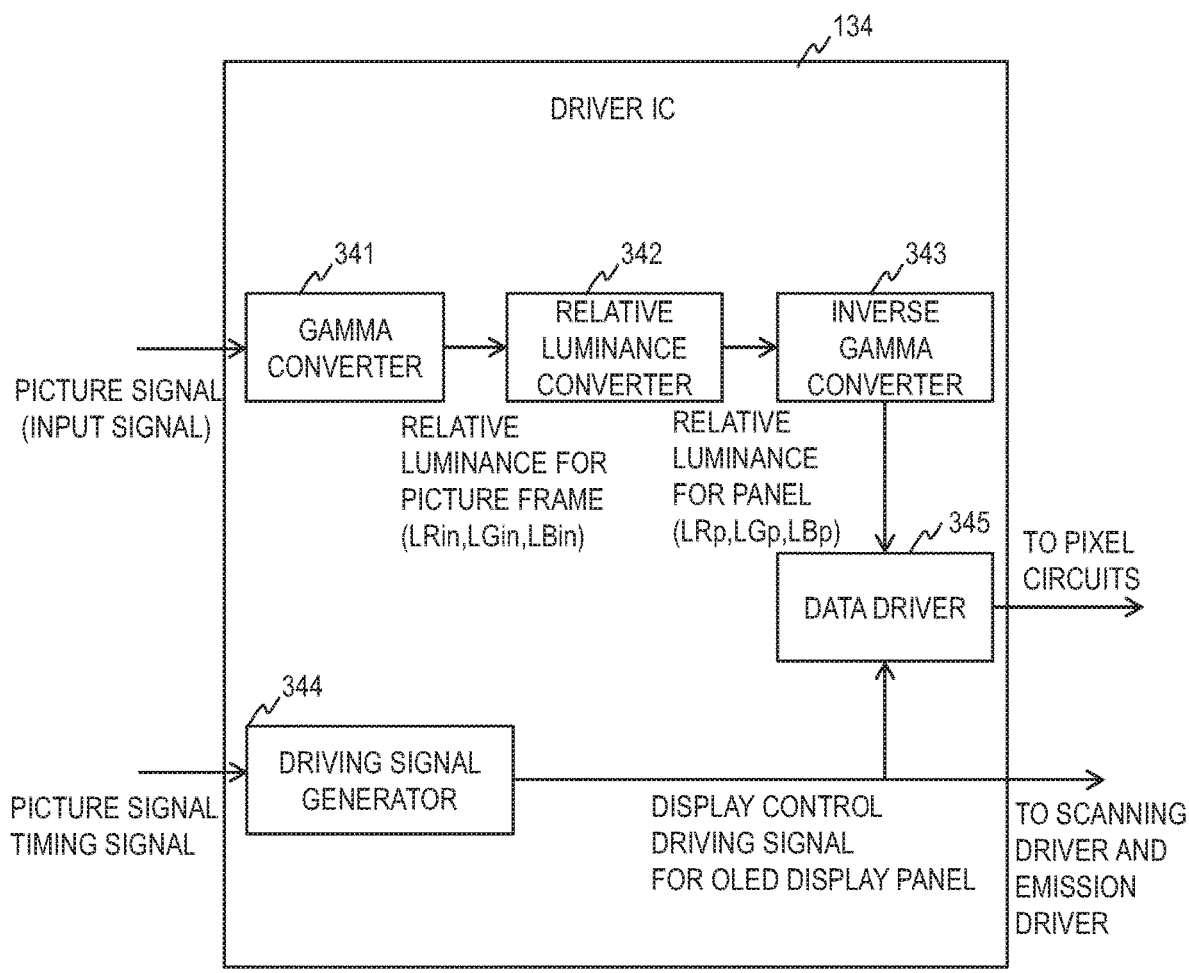
FIG. 3 illustrates logical elements of a driver IC.

FIG. 3 illustrates logical elements of the driver IC 134. The driver IC 134 includes a gamma converter 341, a relative luminance converter 342, an inverse gamma converter 343, a driving signal generator 344, and a data driver 345.

The driver IC 134 receives a picture signal and a picture signal timing signal from a not-shown main controller. The picture signal includes data (signal) for successive video frames. The gamma converter 341 converts the RGB scale values (signal) included in the input picture signal to RGB relative luminance values. More specifically, the gamma converter 341 converts the R scale values, the G scale values, and the B scale values for individual pixels of each video frame into R relative luminance values, G relative luminance values, and B relative luminance values. The relative luminance values are also referred to simply as luminance values. The relative luminance values for a pixel are luminance values normalized in the video frame.

The relative luminance converter 342 converts the R, G, B relative luminance values for individual pixels of a video frame into R, G, B relative luminance values for subpixels of the OLED display panel. The relative luminance value for a subpixel is a luminance value for the subpixel normalized in the OLED display panel. The relative luminance converter 342 determines relative luminance values for the subpixels of individual display pixels from the R, G, and B relative luminance values of the pixels in a video frame. The display pixel will be described later. As noted from this description, the scale values correspond to the luminance values (relative luminance values or absolute luminance values) on a one-to-one basis; one represents the other and determining either one means determining the other one.

The inverse gamma converter 343 converts the relative luminance values for the R subpixels, G subpixels, and B subpixels calculated by the relative luminance converter 342 to scale values for the R subpixels, G subpixels, and B subpixels. The data driver 345 sends a driving signal in accordance with the scale values for the R subpixels, G subpixels, and B subpixels to the pixel circuits.

The driving signal generator 344 converts an input picture signal timing signal to a display control driving signal for the OLED display panel. The picture signal timing signal includes a dot clock (pixel clock) for determining the data transfer rate, a horizontal synchronization signal, a vertical synchronization signal, and a data enable signal.

The driving signal generator 344 generates control signals for the data driver 345, the scanning driver 131, and the emission driver 132 of the delta-nabla panel (or the driving signal for the panel) from the dot clock of the picture signal timing signal, the data enable signal, the vertical synchronization signal, and the horizontal synchronization signal input thereto and outputs the generated signals to the drivers.

Pixel Circuit

Figure 4A:
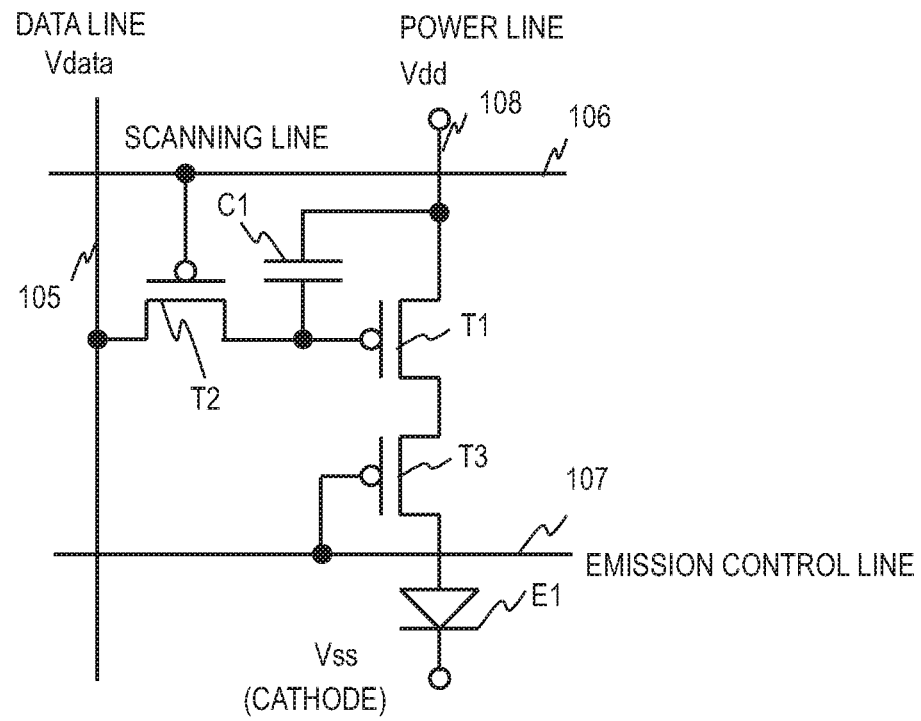
FIG. 4A illustrates an example of a pixel circuit.

A plurality of pixel circuits are formed on the substrate 100 to control electric current to be supplied to the anode electrodes of subpixels. FIG. 4A illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs.

The selection transistor T2 is a switch for selecting the sub-pixel. The selection transistor T2 is a p-channel TFT and its gate terminal is connected with a scanning line 106. The source terminal is connected with a data line 105. The drain terminal is connected with the gate terminal of the driving transistor T1.

The driving transistor T1 is a transistor (driving TFT) for driving the OLED element E1. The driving transistor T1 is a p-channel TFT and its gate terminal is connected with the drain terminal of the selection transistor T2. The source terminal of the driving transistor T1 is connected with a power line (Vdd) 108. The drain terminal is connected with the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 is a p-channel TFT and its gate terminal is connected with an emission control line 107. The source terminal of the emission transistor T3 is connected with the drain terminal of the driving transistor T1. The drain terminal of the emission transistor T3 is connected with the OLED element E1.

Next, operation of the pixel circuit is described. The scanning driver 131 outputs a selection pulse to the scanning line 106 to turn on the transistor T2. The data voltage supplied from the driver IC 134 through the data line 105 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 132 outputs a control signal to the emission control line 107 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

Figure 4B:
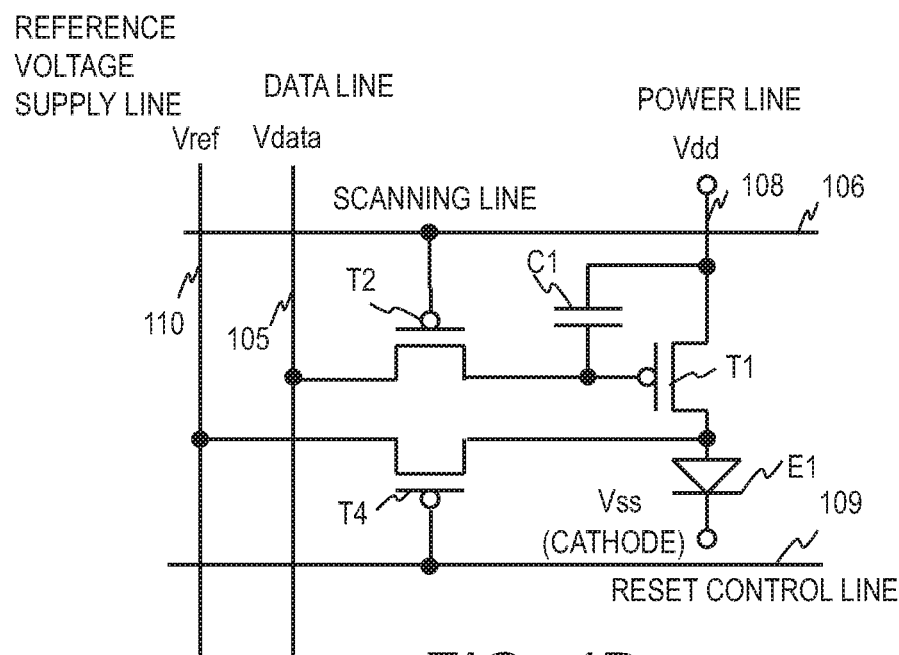
FIG. 4B illustrates another example of a pixel circuit.

FIG. 4B illustrates another configuration example of a pixel circuit. This pixel circuit includes a reset transistor T4 in place of the emission transistor T3 in FIG. 4A. The reset transistor T4 controls the electric connection between a reference voltage supply line 110 and the anode of the OLED element E1. This control is performed in accordance with a reset control signal supplied from the emission driver 132 to the gate of the reset transistor T4 through a reset control line 109.

The reset transistor T4 can be used for various purposes. For example, the reset transistor T4 can be used to reset the anode electrode of the OLED element E1 once to a sufficiently low voltage that is lower than the black signal level to prevent crosstalk caused by leak current between OLED elements E1.

The reset transistor T4 can also be used to measure a characteristic of the driving transistor T1. For example, the voltage-current characteristic of the driving transistor T1 can be accurately measured by measuring the current flowing from the power line (Vdd) 108 to the reference voltage supply line (Vref) 110 under the bias conditions selected so that the driving transistor T1 will operate in the saturated region and the reset transistor T4 will operate in the linear region. If the differences in voltage-current characteristic among the driving transistors T1 for individual subpixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 110 when the driving transistor T1 is off and the reset transistor T4 is operating in the linear region. In the case where the OLED element E1 is deteriorated because of long-term use, for example, if the deterioration is compensated for by generating a data signal at an external circuit, the display device can have a long life spun.

The circuit configurations in FIGS. 4A and 4B are examples; the pixel circuit may have a different circuit configuration. Although the pixel circuits in FIGS. 4A and 4B include p-channel TFTs, the pixel circuit may employ n-channel TFTs.

Pixel Disposition in Delta-Nabla Panel

Figure 5:
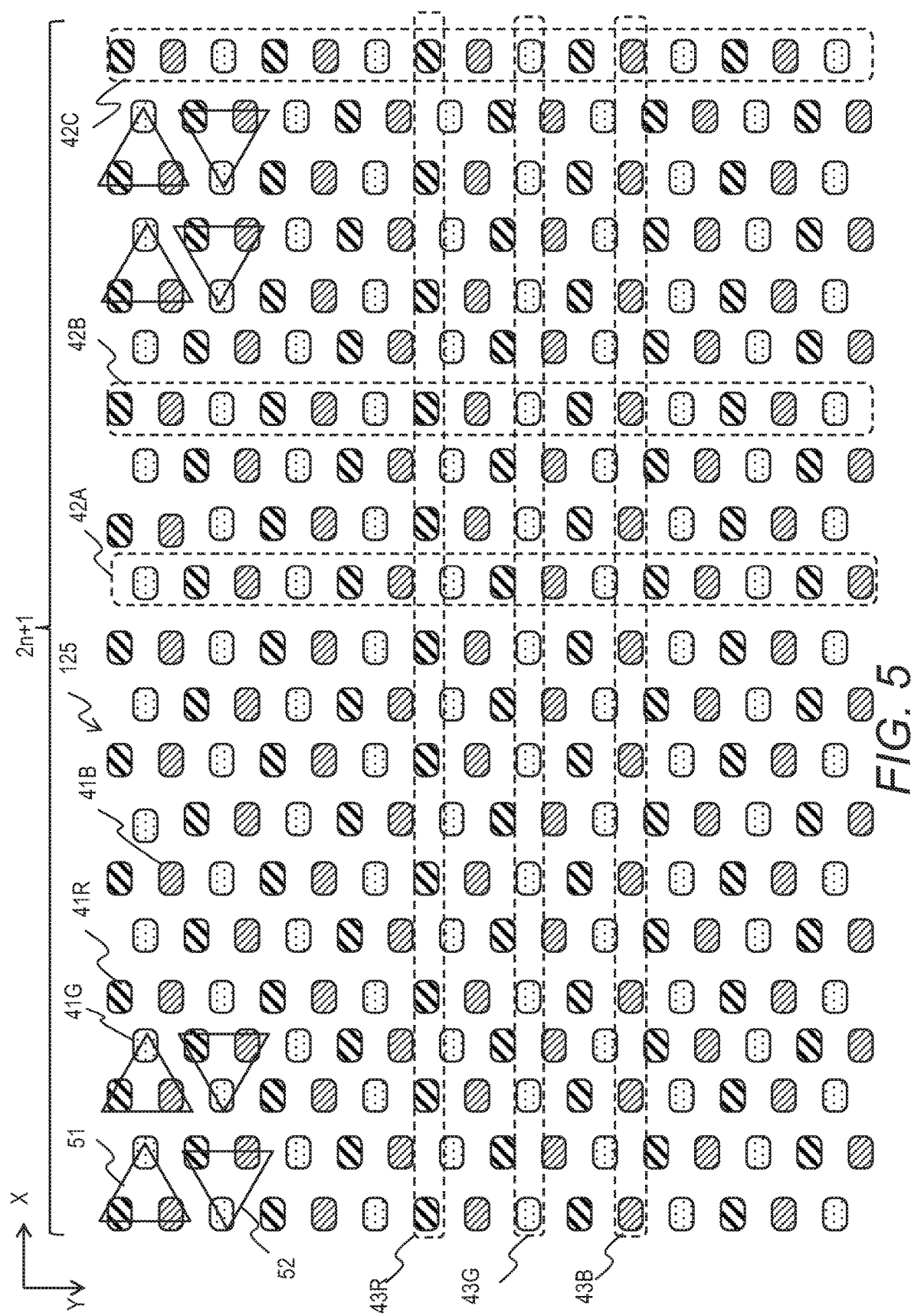
FIG. 5 illustrates a pixel disposition in a delta-nabla panel.

FIG. 5 illustrates a pixel disposition in a delta-nabla panel. FIG. 5 schematically illustrates the entire display region 125. The display region 125 is composed of a plurality of red subpixels 41R, a plurality of green subpixels 41G, and a plurality of blue subpixels 41B disposed in a plane. In FIG. 5, one of the red subpixels, one of the green subpixels, and one of the blue subpixels are provided with reference signs by way of example. The rounded rectangles identically hatched in FIG. 5 represent subpixels of the same color. Although the subpixels in FIG. 5 have rectangular shapes, subpixels may have desired shapes, such as hexagonal or octagonal shapes.

The display region 125 includes a plurality of subpixel rows extending along the X-axis (the first axis) and disposed one above another along the Y-axis (the second axis). In FIG. 5, one of the red subpixel rows is provided with a reference sign 43R, one of the green subpixel rows is provided with a reference sign 43G, and one of the blue subpixel rows is provided with a reference sign 43B, by way of example.

The X-axis and the Y-axis are perpendicular to each other within the plane where the subpixels are disposed. The X-direction is one of the two opposite directions along the X-axis and is directed from the left to the right of FIG. 5. The Y-direction is one of the two opposite directions along the Y-axis and is directed from the top to the bottom of FIG. 5.

In the example of FIG. 5, each subpixel row is composed of subpixels of the same color disposed at a predetermined pitch. Specifically, each subpixel row 43R is composed of red subpixels 41R disposed along the X-axis; each subpixel row 43G is composed of green subpixels 41G disposed along the X-axis; and each subpixel row 43B is composed of blue subpixels 41B disposed along the X-axis. The red subpixel rows 43R, green subpixel rows 43G, and blue subpixel rows 43B are cyclically disposed along the Y-axis.

That is to say, a subpixel row is sandwiched between subpixel rows of the other two colors. For example, a green subpixel row 43G is disposed between a red subpixel row 43R and a blue subpixel row 43B. In the example of FIG. 5, a red subpixel row 43R, a green subpixel row 43G, and a blue subpixel row 43B are disposed in this order and this cycle is repeated. The order of color can be different from this example.

Two subpixel rows adjacent to each other are disposed at different positions along the X-axis. That is to say, each subpixel of a subpixel row is located between subpixels adjacent to each other of the next subpixel row. In the example of FIG. 5, each subpixel row is shifted by a half pitch with respect to the next subpixel row. One pitch is a distance between subpixels adjacent to each other in a subpixel row. A subpixel included in the first subpixel row is located at the middle between two subpixels adjacent to each other included in the subpixel row next to the first subpixel row.

The display region 125 includes a plurality of subpixel columns extending along the Y-axis and disposed side by side along the X-axis. Specifically, the display region 125 includes (2n+1) subpixel columns, where n is a natural number. In FIG. 5, three subpixel columns are provided with reference signs 42A, 42B, and 42C. A subpixel column is composed of subpixels disposed along the Y-axis.

Each subpixel column 42 is composed of red subpixels 41R, green subpixels 41G, and blue subpixels 41B cyclically disposed at a predetermined pitch. In the example of FIG. 5, a red subpixel 41R, a blue subpixel 41B, and a green subpixel 41G are disposed in this order and this cycle is repeated in the Y-direction (the direction directed from the top to the bottom in FIG. 5). The order of color can be different from this example.

Two subpixel columns adjacent to each other are disposed at different positions along the Y-axis; each subpixel included in the first subpixel column is located between subpixels of the other two colors included in the subpixel column next to the first subpixel column. In the example of FIG. 5, each subpixel column is shifted by a half pitch with respect to the next subpixel column. One pitch is a distance along the Y-axis between subpixels of the same color. For example, a green subpixel 41G is located at the middle between a red subpixel 41R and a blue subpixel 41B of the next subpixel column, with respect to the Y-axis.

In this embodiment, a subpixel line extending along the X-axis is referred to as subpixel row and a subpixel line extending along the Y-axis is referred to as subpixel column for descriptive purposes; however, the orientations of the subpixel rows and the subpixel columns are not limited to these examples.

The display region 125 has (2n+1) subpixel columns as described above; it is symmetrical along the X-axis (horizontally symmetrical). The conventional display region in delta-nabla arrangement has 2n subpixel columns. In other words, the conventional display region has a configuration where the subpixel column 42C at one end is removed from the display region 125 in FIG. 5.

As illustrated in FIG. 5, the display region having 2n subpixel columns is composed of two types of panel pixels disposed in a matrix. The two types of panel pixels are first type of panel pixels 51 and second type of panel pixels 52. Each of the panel pixels 51 and 52 corresponds to one pixel in a video frame in real-resolution display.

In FIG. 5, one of the first type of panel pixels is provided with a reference sign 51 and one of the second type of panel pixels is provided with a reference sign 52 by way of example. In FIG. 5, some of the first type of panel pixels 51 are indicated by triangles oriented so that one of the vertices is located on the right and the other two vertices are located on the left. In addition, some of the second type of panel pixels 52 are indicated by triangles oriented so that one of the vertices is located on the left and the other two vertices are located on the right.

A first type of panel pixel 51 and a second type of panel pixel 52 each consist of one green subpixel 41G, and the red subpixel 41R and the blue subpixel 41B adjacent to the green subpixel 41G in a subpixel column 42 adjacent to the subpixel 41G. The red subpixel 41R and the blue subpixel 41B are adjacent to each other and the green subpixel 41G is located between the red subpixel 41R and the blue subpixel 41B with respect to the Y-axis.

In real-resolution display, a situation occurs such that a single first type of panel pixel 51 or a single second type of panel pixel 52 is displayed. The centroid of a first type of panel pixel 51 or a second type of panel pixel 52 is significantly deviated from the centroid of its green subpixel 41G. Specifically, the centroid of the first type of panel pixel 51 is located on the left of the centroid of its green subpixel 41G. The centroid of the second type of panel pixel 52 is located on the right of the centroid of its green subpixel 41G.

Among a red subpixel 41R, a green subpixel 41G, and a blue subpixel 41B, the green subpixel 41G has the highest relative visibility and the blue subpixel 41B has the lowest. When the centroid of the first type of panel pixel 51 or the second type of panel pixel 52 is significantly deviated from the centroid of its green subpixel 41G, the green subpixel 41 is seen more intensely than the remaining subpixels.

Then, the colors of red, green, and blue are not mixed appropriately so that the panel pixel is seen in a color different from the intended color. For example, as to a single first type of panel pixel 51 intended to be seen white, the center of luminance shifts rightward and the green on the right becomes conspicuous. As to a single second type of panel pixel 52 intended to be seen white, the center of luminance shifts leftward and the green on the left becomes conspicuous.

The OLED display device 10 of this disclosure defines two types of display pixels and determines the luminance values for individual display pixels (the luminance values for the subpixels of each display pixel). The centers of luminance of the two types of display pixels are located on or close to their centroids, so that the single display pixel can properly display the intended color.

Figure 6:
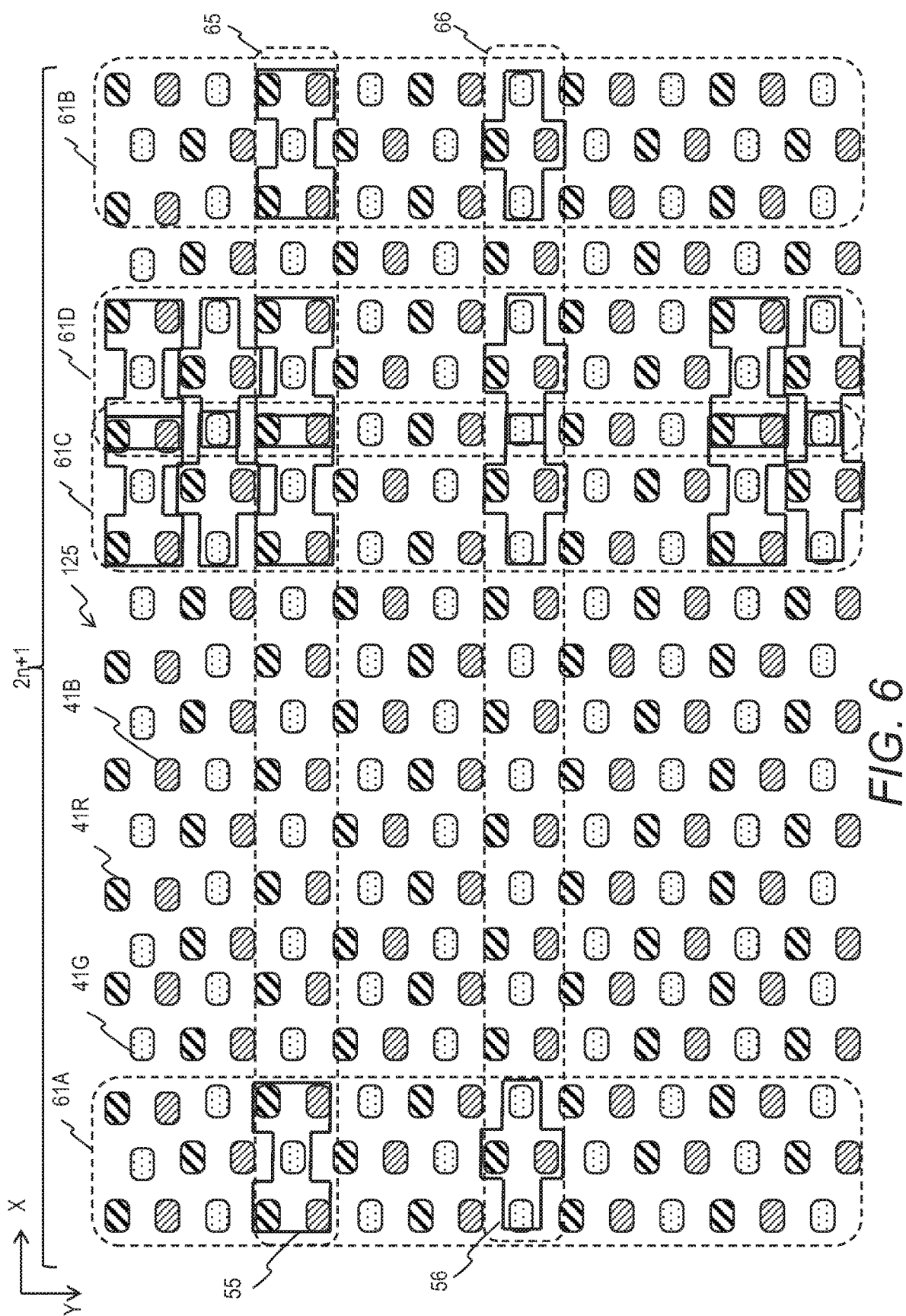
FIG. 6 illustrates a display region in which two types of display pixels of the first type of display pixels and the second types of display pixels are defined.

FIG. 6 illustrates the display region 125 in which two types of display pixels are defined. The two types of display pixels are first type of display pixels 55 and second type of display pixels 56. In FIG. 6, one of the first type of display pixels is provided with a reference sign 55 and one of the second type of display pixels is provided with a reference sign 56. The display region 125 is composed of first type of display pixels 55 and second type of display pixels 56 disposed in a matrix.

Figure 7:
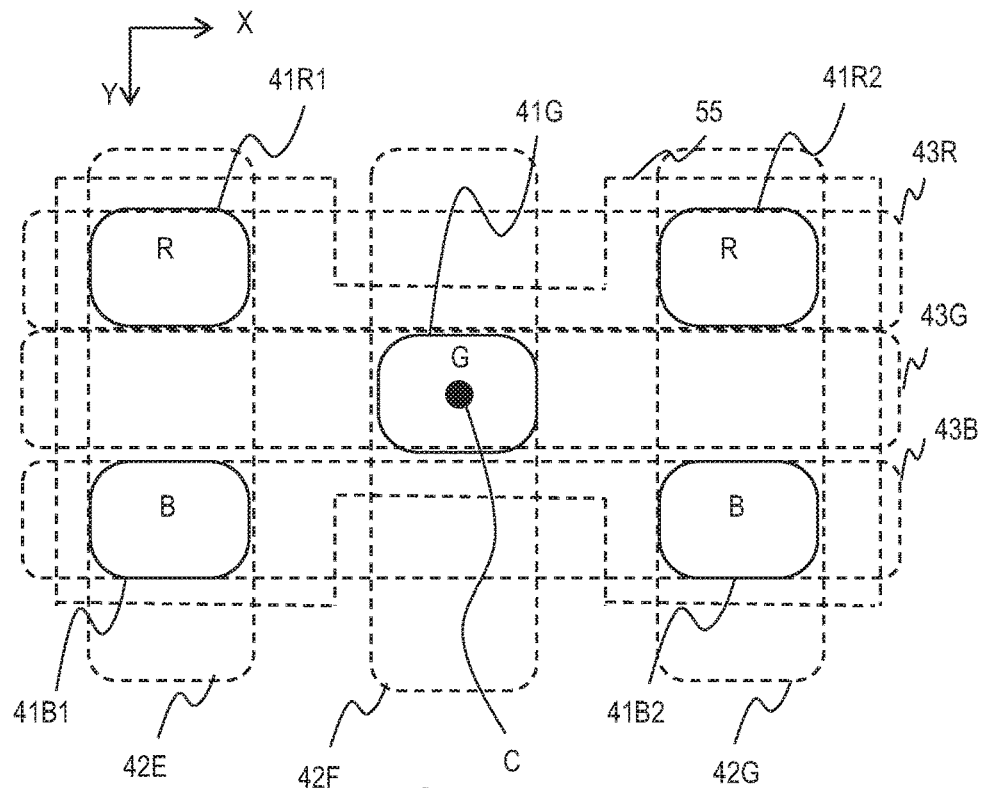
FIG. 7 illustrates a configuration of a first type of display pixel.
Figure 8:
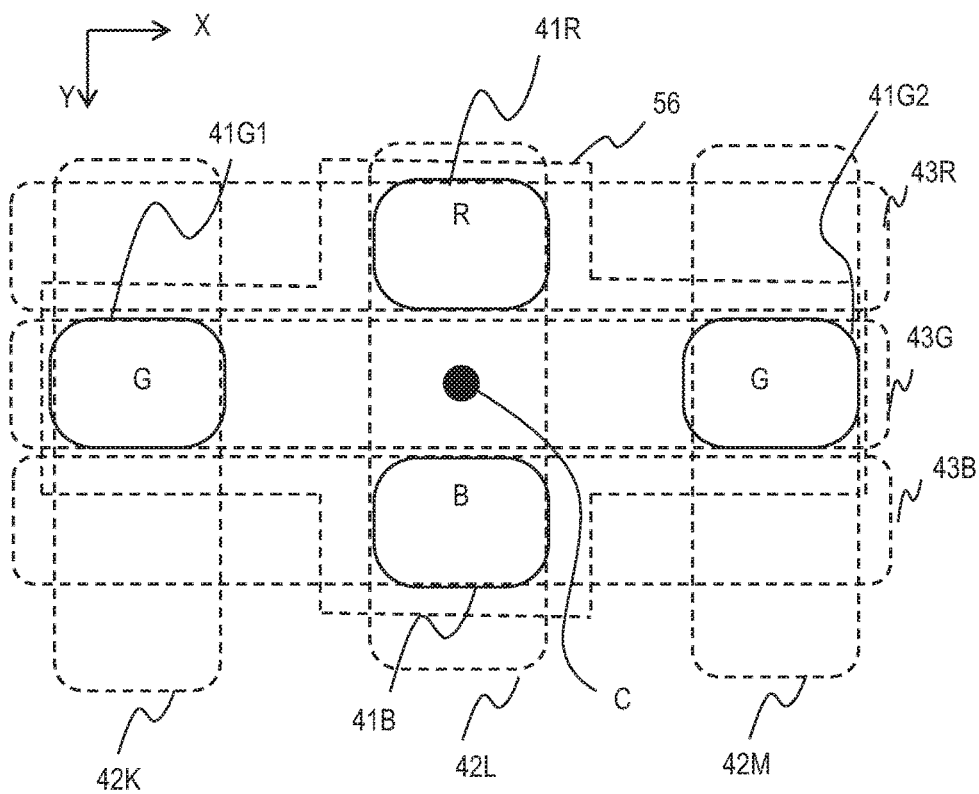
FIG. 8 illustrates a configuration of a second type of display pixel.

FIGS. 7 and 8 illustrate configurations of a first type of display pixel 55 and a second type of display pixel 56. As illustrated in FIG. 7, a first type of display pixel 55 is composed of a plurality of subpixels adjacent to one another. Specifically, a first type of display pixel 55 consists of two red subpixels 41R1 and 41R2, two blue subpixels 41B1 and 41B2, and one green subpixel 41G. In the example of FIG. 7, the centroid of the first type of display pixel 55 and the centroid of the green subpixel 41G are both located at the same position C.

The central green subpixel 41G is surrounded by the other subpixels 41R1, 41R2, 41B1, and 41B2. The red subpixels 41R1 and 41R2 are included in the red subpixel row 43R adjacent to the green subpixel row 43G including the green subpixel 41G and they are adjacent to each other in the red subpixel row 43R. The green subpixel 41G is located between the red subpixels 41R1 and 41R2, particularly at the middle in this example, along the X-axis.

The blue subpixels 41B1 and 41B2 are included in the blue subpixel row 43B adjacent to the green subpixel row 43G including the green subpixel 41G and they are adjacent to each other in the blue subpixel row 43B. The green subpixel 41G is located between the blue subpixels 41B1 and 41B2, particularly at the middle in this example, along the X-axis.

The red subpixel 41R1 and the blue subpixel 41B1 are included in the subpixel column 42E adjacent to the subpixel column 42F including the green subpixel 41G and they are adjacent to each other in the subpixel column 42E. The green subpixel 41G is located between the red subpixel 41R1 and the blue subpixel 41B1, particularly at the middle in this example, along the Y-axis.

The red subpixel 41R2 and the blue subpixel 41B2 are included in the subpixel column 42G adjacent to the subpixel column 42F including the green subpixel 41G and they are adjacent to each other in the subpixel column 42G. The green subpixel 41G is located between the red subpixel 41R2 and the blue subpixel 41B2, particularly at the middle in this example, with respect to the Y axis.

As illustrated in FIG. 8, a second type of display pixel 56 is composed of a plurality of subpixels adjacent to one another. Specifically, a second type of display pixel 56 consists of one red subpixel 41R, one blue subpixel 41B, and two green subpixels 41G1 and 41G2. In the example of FIG. 8, the centroid of the second type of display pixel 56 and the centroid of the green subpixels 41G1 and 41G2 are both located at the same position C.

The two green subpixels 41G1 and 41G2 are included in a green subpixel row 43G and they are adjacent to each other in the green subpixel row 43G. The green subpixel 41G1 is included in a subpixel column 42K and the green subpixel 41G2 is included in a subpixel column 42M.

The red subpixel 41R and the blue subpixel 41B are included in a subpixel column 42L and they are adjacent to each other in the subpixel column 42L. The subpixel column 42L is located between subpixel columns 42K and 42M and it is adjacent to those subpixel columns. Each of the green subpixels 41G1 and 41G2 is located between the red subpixel 41R and the blue subpixel 41B, particularly at the middle in this example, along the Y-axis.

The red subpixel 41R is included in a red subpixel row 43R adjacent to the green subpixel row 43G. The blue subpixel 41B is included in a blue subpixel row 43B adjacent to the green subpixel row 43G. Each of the red subpixel 41R and the blue subpixel 41B is located between the green subpixels 41G1 and 41G2, particularly at the middle in this example, along the X-axis.

The configuration illustrated in FIG. 7 enables the centroid of the first type of display pixel 55 to be located close to the centroid of the central green subpixel 41G, compared to the panel pixel consisting of three subpixels. In the foregoing example, these two centroids coincide with each other. The configuration illustrated in FIG. 8 enables the centroid of the second type of display pixel 56 to be located close to the centroid of the green subpixels 41G1 and 41G2, compared to the panel pixel consisting of three subpixels. In the foregoing example, these two centroids coincide with each other.

Accordingly, the center of luminance of the first type of display pixel 55 is close to or coincides with the centroid of the first type of centroid of display pixel 55, so that the single first type of display pixel 55 displays an intended color. In similar, the center of luminance of the second type of display pixel 56 is close to or coincides with the centroid of the second type of display pixel 56, so that the single second type of display pixel 56 displays an intended color.

Returning to FIG. 6, the display region 125 includes first type of pixel rows 65 and second type of pixel rows 66 disposed alternately along the Y-axis. In FIG. 6, one of the first type of pixel rows is provided with a reference sign 65 and one of the second type of pixel rows is provided with a reference sign 66, by way of example. A first type of display pixel row 65 is composed of first type of display pixels 55 disposed along the X-axis. A second type of display pixel row 66 is composed of second type of pixels 56 disposed along the X-axis.

The display region 125 includes display pixel columns disposed along the X-axis. In FIG. 6, four display pixel columns are provided with reference signs 61A, 61B, 61C, and 61D by way of example. The display region 125 includes the leftmost display pixel column 61A, the rightmost display pixel column 61B, and a plurality of display pixel columns sandwiched therebetween. Each display pixel column is composed of first type of display pixels 55 and second type of display pixels 56 disposed alternately.

The display columns 61C and 61D are adjacent to each other and they share some subpixels. In other words, first type of display pixels 55 adjacent to each other in a first type of display pixel row 65 share two subpixels and second type of display pixels 56 adjacent to each other in a second type of display pixel row 66 share one subpixel.

Figure 9:
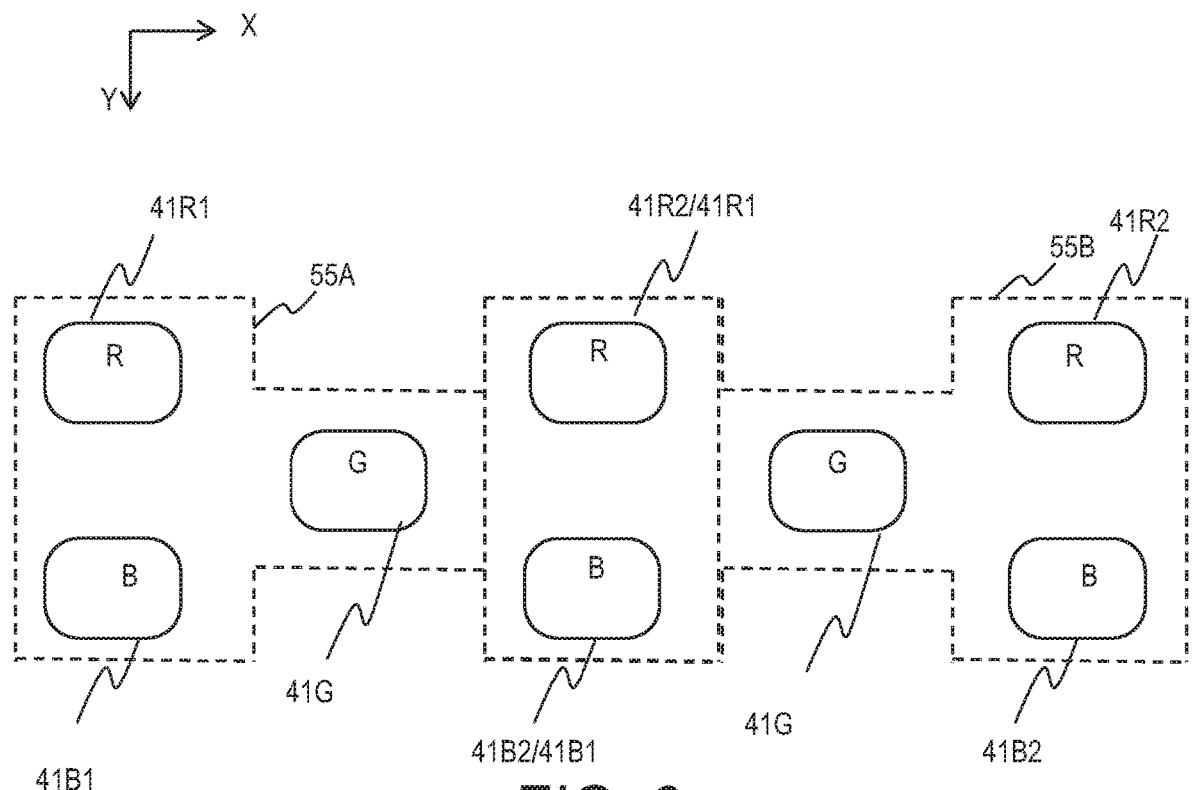
FIG. 9 illustrates a pair consisting of first type of display pixels adjacent to each other.
Figure 10:
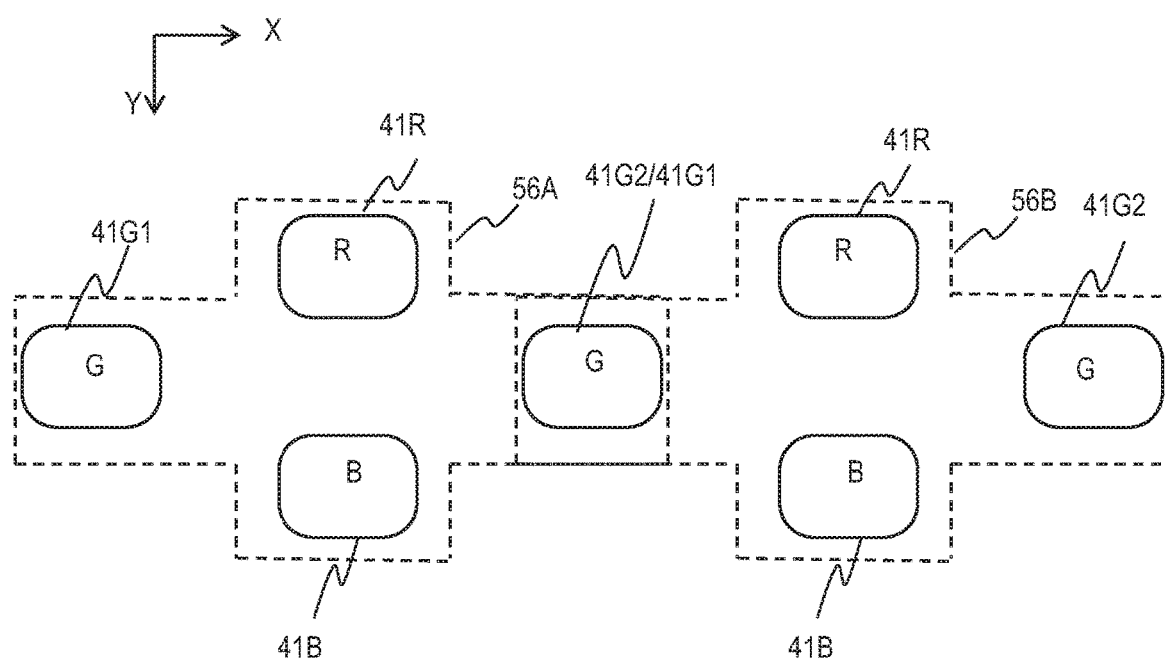
FIG. 10 illustrates a pair consisting of second type of display pixels adjacent to each other.

FIGS. 9 and 10 illustrate a pair consisting of first type of display pixels adjacent to each other and a pair consisting of second type of display pixels adjacent to each other, respectively. As illustrated in FIG. 9, first type of display pixels 55A and 55B adjacent to each other share one red subpixel 41R2/41R1 and one blue subpixel 41B2/41B1. That is to say, the red subpixel 41R2/41R1 and the blue subpixel 41B2/41B1 belong to the first type of display pixels 55A and 55B.

The red subpixel 41R1 and the blue subpixel 41B1 of the first type of display pixel 55A are shared by the first type of display pixel (not shown) on the left of the first type of display pixel 55A. In similar, the red subpixel 41R2 and the blue subpixel 41B2 of the first type of display pixel 55B are shared by the first type of display pixel (not shown) on the right of the first type of display pixel 55B. In a first type of display pixel row 65, the red subpixels and the blue subpixels except for the red subpixel and the blue subpixel at both ends are shared by two first type of display pixels adjacent to each other. In contrast, each green subpixel 41G is exclusively included in a first type of display pixel and belongs to only one first type of display pixel.

As illustrated in FIG. 10, second type of display pixels 56A and 56B adjacent to each other share one green subpixel 41G2/41G1. That is to say, the green subpixel 41G2/41G1 belongs to the second type of display pixels 56A and 56B.

The green subpixel 41G1 of the second type of display pixel 56A is shared by the second type of display pixel (not shown) on the left of the second type of display pixel 56A. In similar, the green subpixel 41G2 of the second type of display pixel 56B is shared by the second type of display pixel (not shown) on the right of the second type of display pixel 56B. In a second type of display pixel row 66, the green subpixels except for the green subpixels at both ends are shared by two second type of display pixels adjacent to each other. In contrast, each red subpixel 41R and each blue subpixel 41B are exclusively included in a second type of display pixel and belong to only one second type of display pixel.

Generation of Luminance Data for Subpixels

Sharing a subpixel between a pair of adjacent first type of display pixels 55 and sharing subpixels between a pair of adjacent second type of display pixels 56 as described above enable an image composed of a plurality of pixels (also called frame pixels) of a video frame to be displayed appropriately.

Hereinafter, determining luminance values for subpixels is described. The driver IC 134 generates luminance data for the display panel from image data for a video frame. The luminance data specifies luminance values (relative luminance values or absolute luminance values) for individual subpixels of the display panel.

The driver IC 134 generates luminance data for first type of display pixels 55 and second type of display pixels 56 from luminance data for the frame pixels of a video frame. In the following example, the number of pixels in a video frame is equal to the number of display pixels in the display panel.

The luminance data for a display pixel specifies luminance values for the subpixels constituting the display pixel. Further, the driver IC 134 determines the luminance value(s) of the subpixel(s) shared between two display pixels based on the luminance values for the subpixel(s) specified by the luminance data for the two display pixels.

Figure 11:
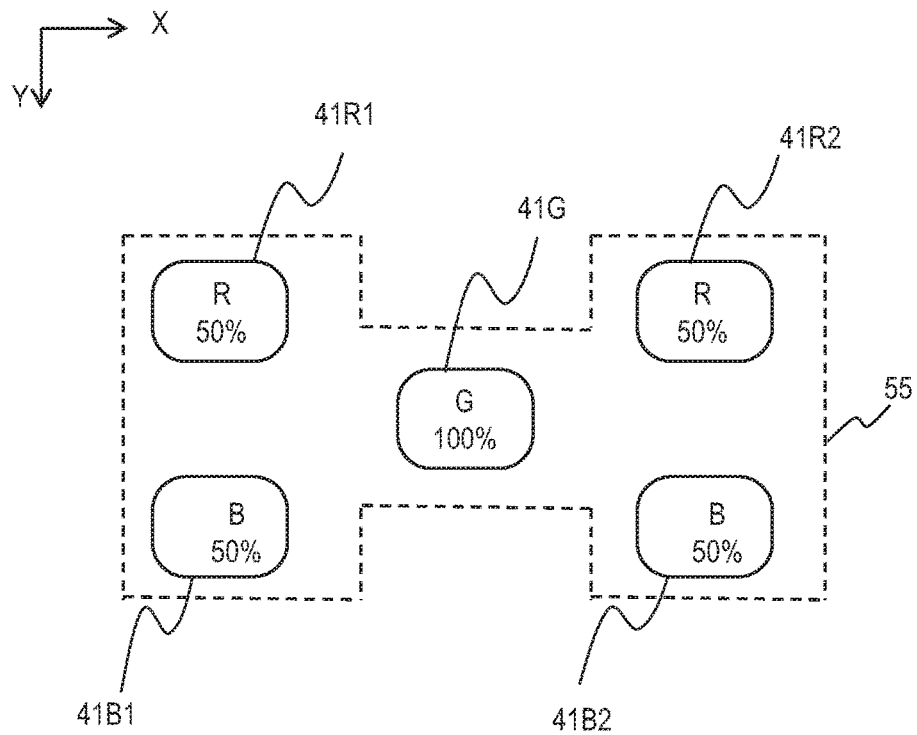
FIG. 11 illustrates luminance values to be assigned to a first type of display pixels.

FIG. 11 illustrates luminance values to be assigned to a first type of display pixel 55. The driver IC 134 determines the luminance data for the first type of display pixel 55 from the luminance data for the corresponding frame pixel. The numerical value within each subpixel in FIG. 11 represents the rate (in percentage) to the red, green, or blue luminance value for the frame pixel.

In the example of FIG. 11, the driver IC 134 assigns the green luminance value (100%) determined from the luminance data for the frame pixel in a predetermined method to the central green subpixel 41G of the first type of display pixel 55. The luminance value determined from the luminance data for the frame pixel in a predetermined method means the luminance value determined based on or with reference to the luminance data for the frame pixel through a predetermined method. The driver IC 134 assigns a half (50%) of the red luminance value determined from the luminance data for the frame pixel in the predetermined method to each of the red subpixels 41R1 and 42R2. Further, the driver IC 134 assigns a half (50%) of the blue luminance value determined from the luminance data for the frame pixel in the predetermined method to each of the blue subpixels 41B1 and 42B2.

The sum of the percentages of the luminance values for the red subpixels 41R1 and 41R2 is 100%. The sum of the percentages of the luminance values for the blue subpixels 41B1 and 41B2 is also 100%. Since the percentages of all colors are 100%, the single first type of display pixel 55 displays the color expected for the display pixel.

Figure 12:
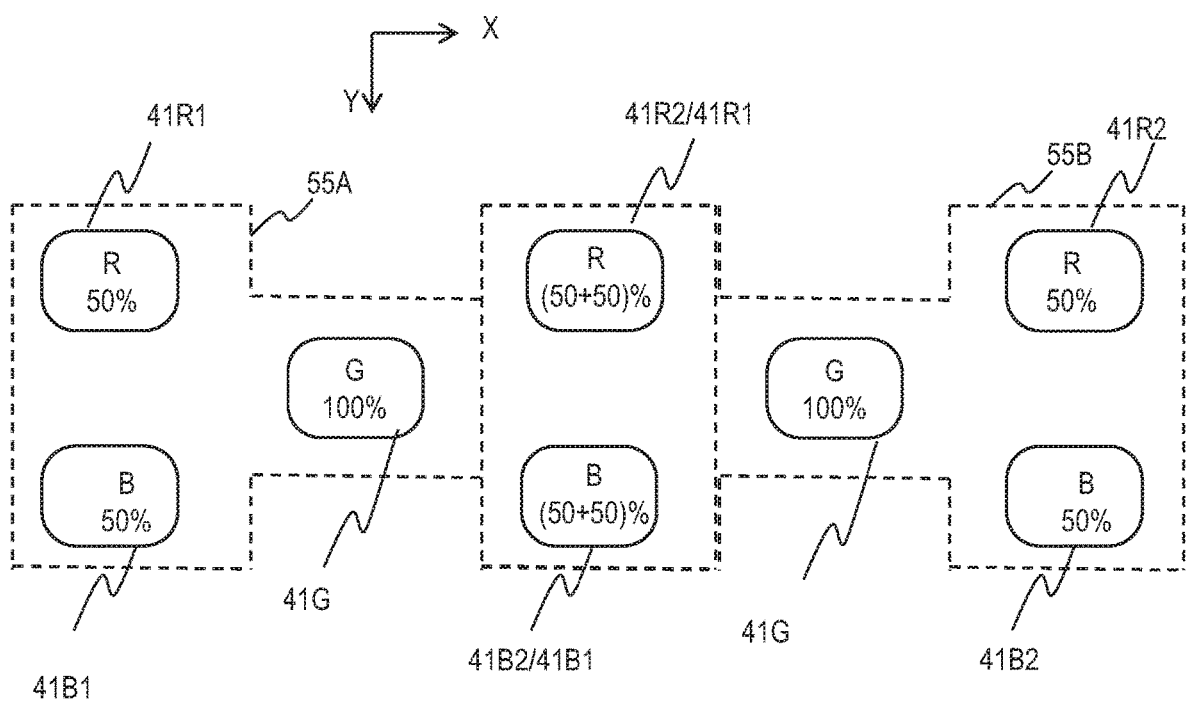
FIG. 12 illustrates luminance values to be assigned to first type of display pixels adjacent to each other.

FIG. 12 illustrates luminance values to be assigned to first type of display pixels 55A and 55B adjacent to each other. Assume that the first type of display pixel on the left of the first type of display pixel 55A and the first type of display pixel on the right of the first type of display pixel 55B are not to be lighted (at a luminance value of 0). The driver IC 134 determines luminance data for the first type of display pixels 55A and 55B from the luminance data for their corresponding frame pixels as described with reference to FIG. 11.

The driver IC 134 assigns the sum of the luminance values for the red subpixel 41R2/41R1 in the first type of display pixels 55A and the red subpixel 41R2/41R1 in the first type of display pixel 55B to the shared subpixel 41R2/41R1. The driver IC 134 assigns the sum of the luminance values for the blue subpixel 41B2/41B1 in the first type of display pixel 55A and the blue subpixel 41B2/41B1 in the first type of display pixel 55B to the shared subpixel 41B2/41B1. As to each remaining subpixel, the driver IC 134 assigns the luminance value determined in the first type of display pixel the subpixel belongs to.

Figure 13:
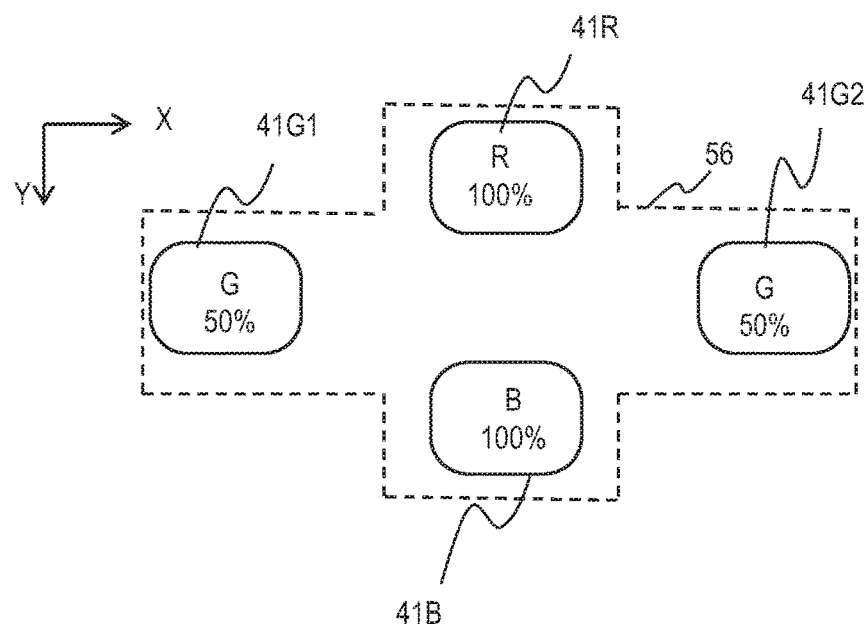
FIG. 13 illustrates luminance values to be assigned to a second type of display pixel.

FIG. 13 illustrates luminance values to be assigned to a second type of display pixel 56. The driver IC 134 determines luminance data for the second type of display pixel 56 from the luminance data for the corresponding frame pixel. The numerical value within each subpixel in FIG. 13 represents the rate (in percentage) to the red, green, or blue luminance value for the frame pixel.

In the example of FIG. 13, the driver IC 134 assigns the red luminance value (100%) determined from the luminance data for the frame pixel in the predetermined method to the red subpixel 41R of the second type of display pixel 56. The driver IC 134 assigns the blue luminance value (100%) determined from the luminance data for the frame pixel in the predetermined method to the blue subpixel 41B of the second type of display pixel 56.

The driver IC 134 assigns a half (50%) of the green luminance value determined from the luminance data for the frame pixel in the predetermined method to each of the green subpixels 41G1 and 42G2. The sum of the percentages of the luminance values for the green subpixels 41G1 and 41G2 is 100%. Since the percentages of all colors are 100%, the single second type of display pixel 56 displays the color expected for the display pixel.

Figure 14:
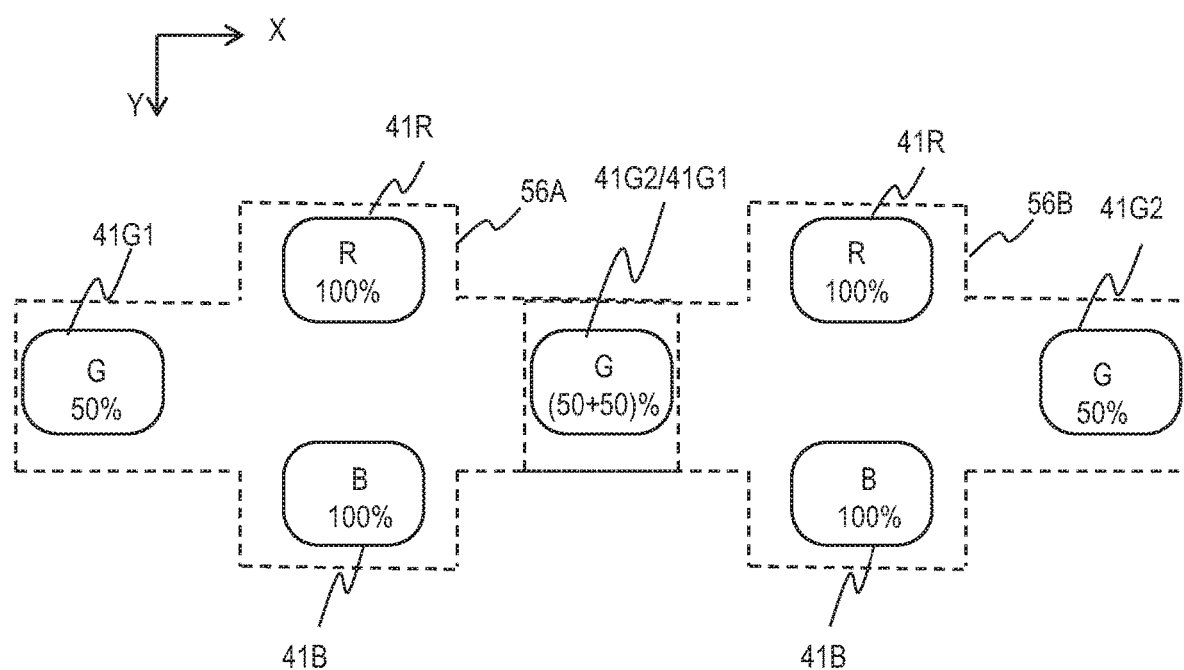
FIG. 14 illustrates luminance values to be assigned to second type of display pixels adjacent to each other.

FIG. 14 illustrates luminance values to be assigned to second type of display pixels 56A and 56B adjacent to each other. Assume that the second type of display pixel on the left of the second type of display pixel 56A and the second type of display pixel on the right of the second type of display pixel 56B are not to be lighted (at a luminance value of 0).

The driver IC 134 determines luminance data for the second type of display pixels 56A and 56B from the luminance data for their corresponding frame pixels as described with reference to FIG. 13. The driver IC 134 assigns the sum of the luminance values for the green subpixel 41G2/41G1 in the second type of display pixel 56A and the green subpixel 41G2/41G1 in the second type of display pixel 56B to the shared subpixel 41G2/41G1. As to each remaining subpixel, the driver IC 134 assigns the luminance value determined in the second type of display pixel the subpixel belongs to.

The green subpixels 41G at both ends of a display line composed of a plurality of second type of display pixels 56 can be assigned smaller percentages (greater reduction rates) than those for the inner green subpixels 41G in assigning luminance values from the luminance values of the corresponding second type of display pixels. A display line is composed of consecutive lighted display pixels. The luminance value of a display pixel is determined by the luminance values of the subpixels constituting the display pixel. This is because that a green subpixel 41G at an end of a display line is seen more intensely and the user tends to see the display line end in a color different from the intended color.

For example, the green subpixels 41G1 and 41G2 at both ends in FIG. 14 are assigned a luminance value rate of 50%, which is the same as the rate to be assigned in a single display pixel. The driver IC 134 can assign a luminance value rate smaller than this, for example 25%, to the green subpixels 41G1 and 41G2 at both ends.

The policy to select the green subpixel 41G at a display line end to assign a reduced luminance value depends on the design. For example, when one of the second type of display pixels 56 sharing a green subpixel 41G is unlighted (or the luminance value thereof is smaller than a specific value) and the other second type of display pixel 56 sharing the green subpixel 41G is lighted (or the luminance value thereof is greater than a specific value), and further when the red subpixel 41R and the blue subpixel 41B adjacent to the green subpixel 41G in the same subpixel column is unlighted (or the luminance value thereof is smaller than a specific value), the luminance value rate to be assigned to the green subpixel 41G is determined to be reduced.

Figure 15:
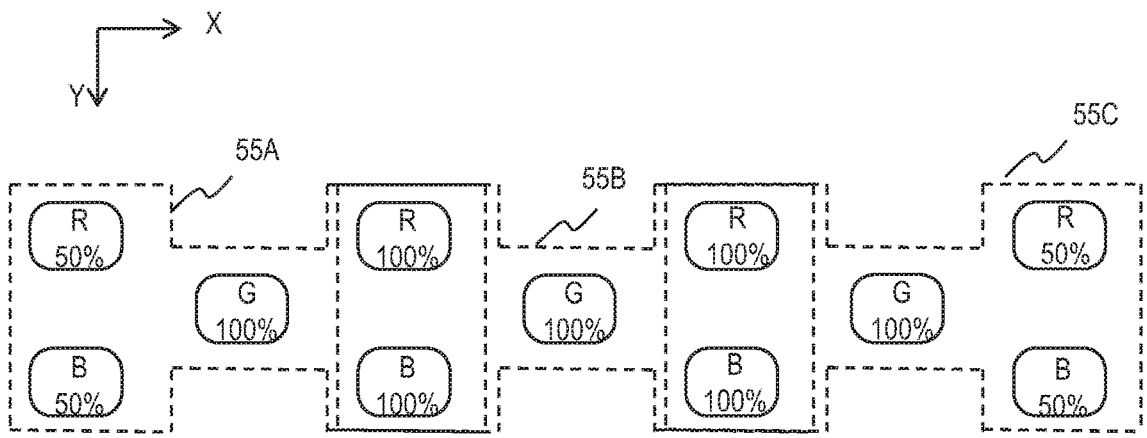
FIG. 15 illustrates luminance values to be assigned to a display line composed of consecutive first type of display pixels.

FIG. 15 illustrates luminance values to be assigned to a display line consisting of consecutive first type of display pixels 55A, 55B, and 55C. The consecutive first type of display pixels 55A, 55B, and 55C correspond to a display line consisting of three frame pixels. The way to assign luminance values is the same as the way to assign luminance values to two first type of display pixels adjacent to each other described with reference to FIG. 12. The luminance value rates for the two red subpixels and two blue subpixels at both ends are 50% and the luminance value rates for the other subpixels are 100%. The line width is the same as that of a line composed of pixels 51 each consisting of three subpixels (see FIG. 5).

Figure 16:
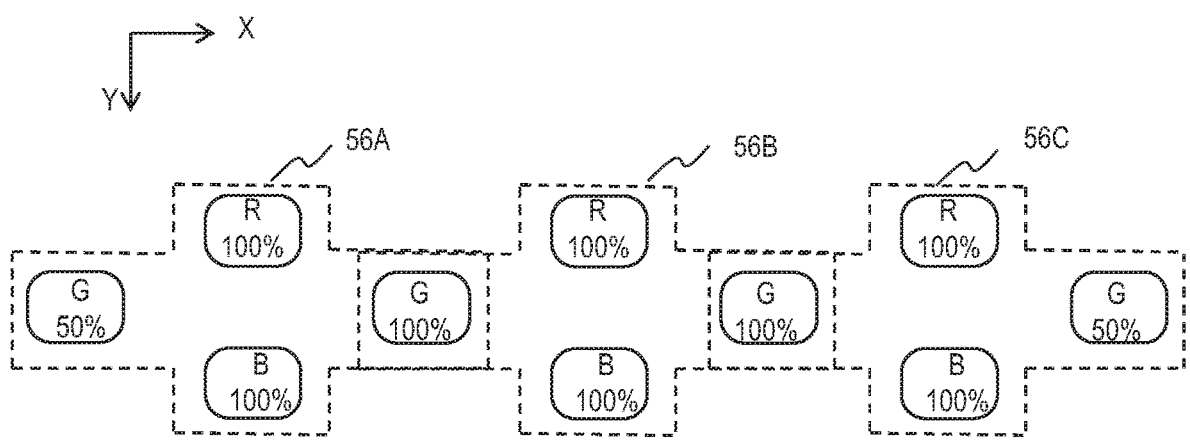
FIG. 16 illustrates luminance values to be assigned to a display line composed of consecutive second type of display pixels.

FIG. 16 illustrates luminance values to be assigned to a display line consisting of consecutive second type of display pixels 56A, 56B, and 56C. The consecutive second type of display pixels 56A, 56B, and 56C correspond to a display line consisting of three frame pixels. The way to assign luminance values is the same as the way to assign luminance values to two second type of display pixels adjacent to each other described with reference to FIG. 14. The luminance value rates for the two green subpixels at both ends are 50% and the luminance value rates for the other subpixels are 100%. The line width is the same as that of a line composed of pixels 52 each consisting of three subpixels (see FIG. 5).

Figure 17:
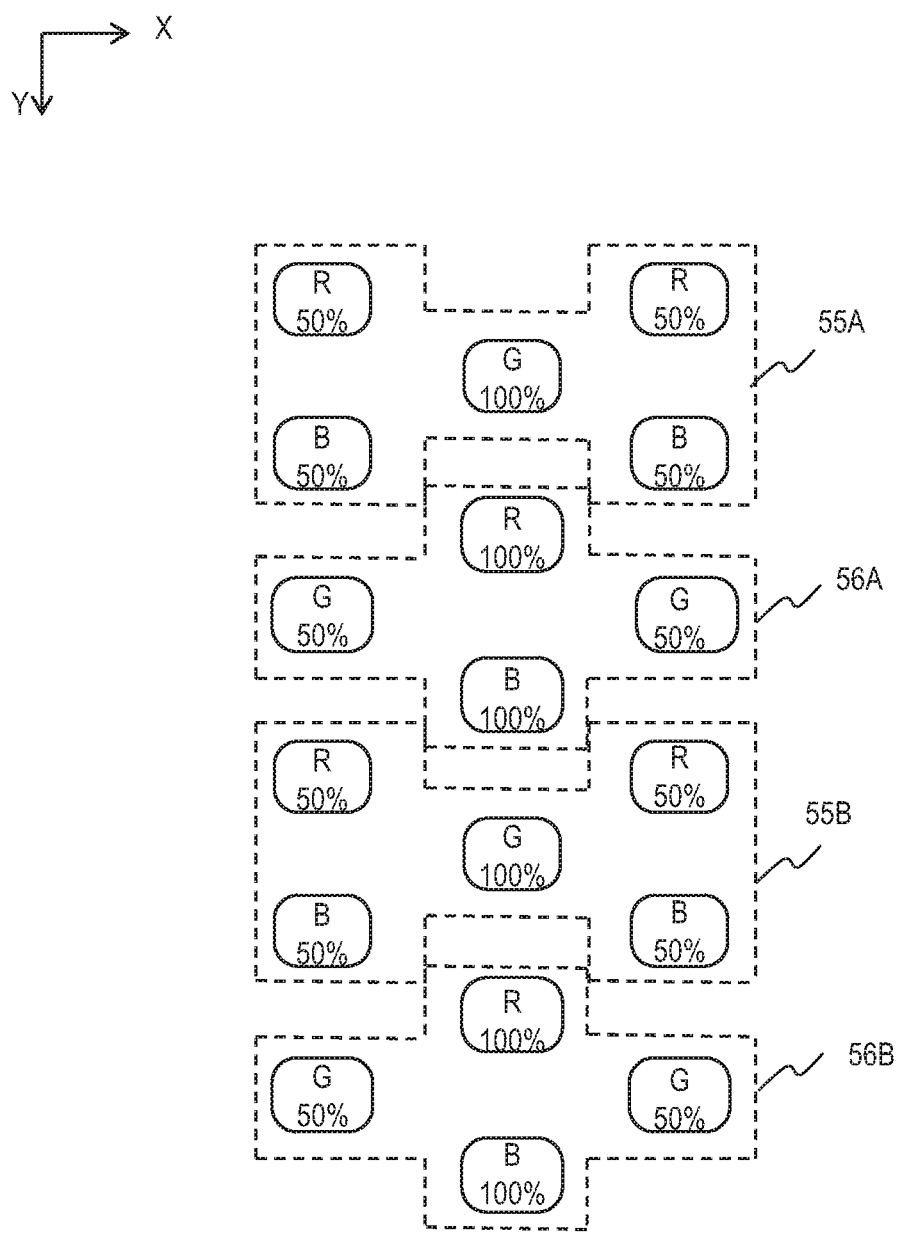
FIG. 17 illustrates first type of display pixels and second type of display pixels consecutive in a display pixel column extending along the Y-axis.

FIG. 17 illustrates a first type of display pixel 55A, a second type of display pixel 56A, a first type of display pixel 55B, and a second type of display pixel 56B that are consecutive in a display pixel column extending along the Y-axis. These consecutive display pixels correspond to a display line consisting of four frame pixels. There is no shared subpixel among the first type of display pixel 55A, the second type of display pixel 56A, the first type of display pixel 55B, and the second type of display pixel 56B.

The luminance values determined in each display pixel are assigned to their subpixels. A display pixel column consists of three subpixel columns. The luminance value rate for the subpixels in the central subpixel column is 100% and the luminance value rates for the subpixels in the subpixel columns on both sides are 50%. The line width is larger than that of a line composed of pixels 51 or 52 consisting of three subpixels. In a line composed of display pixels 55 and 56, however, the central subpixel column is bright and the subpixel columns on both sides are dark, so that the user sees the line as if the line has a width almost equal to the width of a line composed of pixels 51 or 52.

Figure 18:
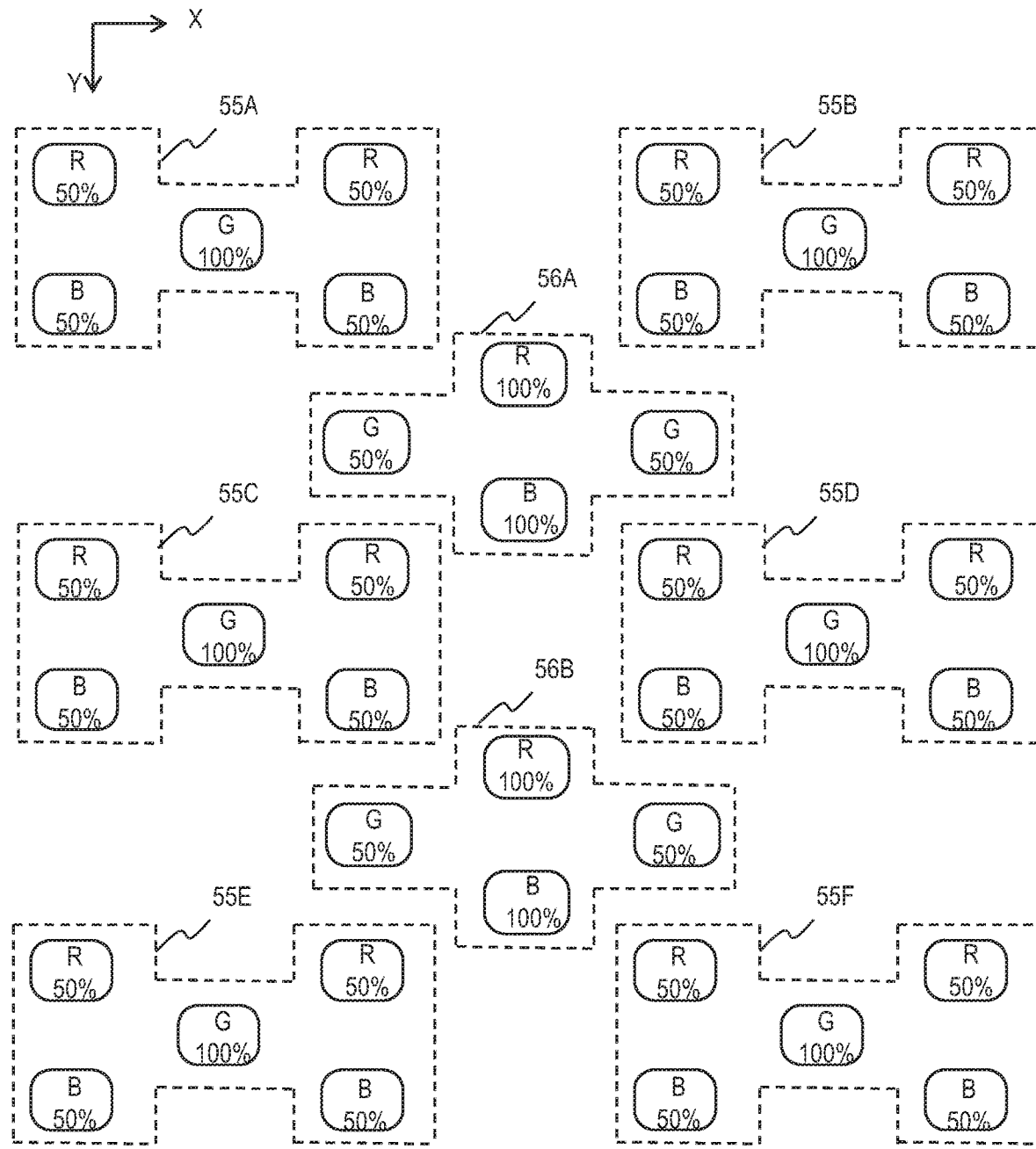
FIG. 18 illustrates a 1×1 checkerboard pattern.

FIG. 18 illustrates a 1×1 checkerboard pattern. The checkerboard pattern in FIG. 18 consists of first type of display pixels 55A to 55F and second type of display pixels 56A and 56B. None of the display pixels to display the checkerboard pattern do not share a subpixel. In the checkerboard pattern formed of display pixels illustrated in FIG. 18, the distribution of the centers of luminance and the total luminance of the pixels accurately reflect data of a video frame.

As described above, a display device having delta-nabla pixel arrangement attains improved quality in single-pixel display in real-resolution display by configuring the display region 125 with two types of display pixels 55 and 56 disposed in a matrix. The above-described way to determine luminance values for subpixels enables any combination of pixels from a single pixel to a complex pattern to be displayed properly. For example, a line and a space can be displayed at proper luminance and further, a complex pattern like a checkerboard can be displayed properly with an accurate distribution of centers of luminance and accurate total luminance of the pixels, as described with reference to FIGS. 15 to 18, The driver IC 134 can determine the luminance values to be assigned to the subpixels of first type of display pixels 55 and the subpixels of second type of display pixels 56 in accordance with a policy different from the foregoing example. For example, the driver IC 134 can use a formula different from the predetermined rates of the luminance values determined from luminance data for frame pixels. In any way of calculation, the luminance values assigned to the subpixels shared between display pixels adjacent to each other are to be smaller than the luminance values determined from the luminance data for frame pixels. However, in the case where the luminance value determined from the luminance data for frame pixels is 0, the luminance value for the subpixels of the display pixel is also 0.

As to the first type of display pixels 55, the luminance value rates to be assigned to two red subpixels 41R1 and 41R2 can be different and the luminance value rates to be assigned to two blue subpixels 41B1 and 41B2 can also be different. The luminance value rates for the shared red subpixel 41R2/41R1 and the shared blue subpixel 41B2/41B1 can be calculated in a way based on the luminance value rates for the two first type of display pixels 55A and 55B but different from summing the luminance value rates.

As to the second type of display pixels 56, the luminance value rates to be assigned to two green subpixels 41G1 and 41G2 can be different. The luminance value rate for the shared green subpixel 41G2/41G1 can be calculated in a way based on the luminance value rates for the two second type of display pixels 56A and 56B but different from summing the luminance value rates.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
a display panel; and
a control device configured to control the display panel,
wherein a display region of the display panel includes a plurality of subpixel rows each extending along a first axis,
wherein the plurality of subpixel rows include red subpixel rows composed of red subpixels, blue subpixel rows composed of blue subpixels, and green subpixel rows composed of green subpixels, the red subpixel rows, the blue subpixel rows and the green subpixel rows being cyclically disposed one above another,
wherein subpixel rows adjacent to each other in the plurality of subpixel rows are located at different positions along the first axis, wherein each of the plurality of subpixel columns is composed of red subpixels, green subpixels, and blue subpixels cyclically disposed one above another, wherein the control device is configured to determine luminance data for each of a first type of display pixels and a second type of display pixels in the display region from luminance data for each frame pixel included in a video frame, wherein a number of the frame pixels of the video frame is equal to a total number of the first type of display pixels and the second type of display pixels, and the frame pixels correspond to the first type of display pixels and the second type of display pixels on a one-to-one basis, wherein each of the first type of display pixels consists of:
one green subpixel,
two red subpixels included in a red subpixel row adjacent to a green subpixel row including the one green subpixel, each of the two red subpixels being included in a different subpixel column adjacent to a subpixel column including the one green subpixel, and
two blue subpixels included in a blue subpixel row adjacent to the green subpixel row including the one green subpixel, each of the two blue subpixels being included in the different subpixel column adjacent to the subpixel column including the one green subpixel,
the one green subpixel being a center on the first axis, the two red subpixels and the two blue subpixels being symmetrically arranged with respect to a second axis perpendicular to the first axis, wherein each of the second type of display pixels consists of:
two green subpixels adjacent to each other in one green subpixel row,
one red subpixel included in a subpixel column between subpixel columns each including one of the two green subpixels and in a red subpixel row adjacent to the one green subpixel row, and
one blue subpixel included in the subpixel column between the subpixel columns each including one of the two green subpixels and in a blue subpixel row adjacent to the one green subpixel row,
the one red subpixel and the one blue subpixel being a center on the first axis, the two green subpixels being symmetrically arranged with respect to the second axis, wherein rows composed of the first type of display pixels disposed along the first axis and rows composed of the second type of display pixels disposed along the first axis are disposed alternately along the second axis in the display region, wherein, in each of the rows composed of the first type of display pixels, the first type of display pixels adjacent to each other share a red subpixel and a blue subpixel and each green subpixel belongs to one first type of display pixel exclusively, wherein, in each of the rows composed of the second type of display pixels, the second type of display pixels adjacent to each other share a green subpixel and each red subpixel and each blue subpixel belong to one second type of display pixel exclusively, wherein the display region consists of (2n+1) subpixel columns each extending along the second axis, where n is a natural number, and wherein the control device is configured to:
determine a luminance value to be assigned from a first frame pixel to the green subpixel of a corresponding first type of display pixel based on luminance data for the first frame pixel in a predetermined method,
determine a luminance value to be assigned from the first frame pixel to each of the two red subpixels of the first type of display pixel to be a value lower than a luminance value determined for one red subpixel based on the luminance data for the first frame pixel in the predetermined method,
determine a luminance value to be assigned from the first frame pixel to each of the two blue subpixels of the first type of display pixel to be a value lower than a luminance value determined for one blue subpixel based on the luminance data for the first frame pixel in the predetermined method,
determine a luminance value to be assigned from a second frame pixel to each of the red subpixel and the blue subpixel of a corresponding second type of display pixel based on luminance data for the second frame pixel in the predetermined method,
determine a luminance value to be assigned from the second frame pixel to each of the two green subpixels of the second type of display pixel to be a value lower than a luminance value determined for one green subpixel based on the luminance data for the second frame pixel in the predetermined method,
determine luminance values to be assigned to the red subpixel and the blue subpixel shared between the first type of display pixels adjacent to each other based on luminance values to be assigned in both of the first type of display pixels adjacent to each other, and
determine a luminance value to be assigned to the green subpixel shared between the second type of display pixels adjacent to each other based on luminance values to be assigned in both of the second type of display pixels adjacent to each other.

2. The display device according to claim 1, wherein the control device is configured to:
determine the luminance value to be assigned from the first frame pixel to each of the two red subpixels of the first type of display pixel to be a half of the luminance value determined for one red subpixel in the predetermined method;
determine the luminance value to be assigned from the first frame pixel to each of the two blue subpixels of the first type of display pixel to be a half of the luminance value determined for one blue subpixel in the predetermined method; and
determine the luminance value to be assigned from the second frame pixel to each of the two green subpixels of the second type of display pixel to be a half of the luminance value determined for one green subpixel in the predetermined method.

3. The display device according to claim 1, wherein the control device is configured to, in displaying a display line composed of a plurality of consecutive second type of display pixels to be lighted along the first axis, determine a luminance value to be assigned from a second frame pixel to the first green subpixel located at either end of the display line to be a value lower than a luminance value to be assigned from the second frame pixel to the other second green subpixel of the same second type of display pixel.

4. The display device according to claim 1, wherein the control device is configured to:

determine the luminance value to be assigned from the first frame pixel to each of the two red subpixels of the first type of display pixel to be a half of the luminance value determined for one red subpixel in the predetermined method;

determine the luminance value to be assigned from the first frame pixel to each of the two blue subpixels of the first type of display pixel to be a half of the luminance value determined for one blue subpixel in the predetermined method;

determine a luminance value to be assigned from a second frame pixel to the first green subpixel located at either end of a display line composed of a plurality of consecutive second type of display pixels to be lighted along the first axis to be a value lower than a luminance value to be assigned from the second frame pixel to the other second green subpixel of the same second type of display pixel;

determine a luminance value to be assigned from the second frame pixel to the second green subpixel to be a half of a luminance value determined for one green subpixel in the predetermined method; and determine a luminance value to be assigned from another second frame pixel to each of the two green subpixels of a corresponding second type of display pixel located inner than the second type of display pixels located at both ends of the display line to be a half of a luminance value determined for one green subpixel in the predetermined method.

5. The display device according to claim 1, wherein centers of luminance of the two types of display pixels are located on or close to centroids of each of the two types of display pixels.

6. A control method for a display device, the display device having a display region including a plurality of subpixel rows each extending along a first axis, the plurality of subpixel rows including red subpixel rows composed of red subpixels, blue subpixel rows composed of blue subpixels, and green subpixel rows composed of green subpixels, the red subpixel rows, the blue subpixel rows and the green subpixel rows being cyclically disposed one above another, subpixel rows adjacent to each other in the plurality of subpixel rows being located at different positions along the first axis, each of the plurality of subpixel columns being composed of red subpixels, green subpixels, and blue subpixels cyclically disposed one above another, the display region including a first type of display pixels each consisting of:
one green subpixel,
two red subpixels included in a red subpixel row adjacent to a green subpixel row including the one green subpixel, each of the two red subpixels being included in a different subpixel column adjacent to a subpixel column including the one green subpixel, and
two blue subpixels included in a blue subpixel row adjacent to the green subpixel row including the one green subpixel, each of the two blue subpixels being included in the different subpixel column adjacent to the subpixel column including the one green subpixel,
the one green subpixel being a center on the first axis, the two red subpixels and the two blue subpixels being symmetrically arranged with respect to a second axis perpendicular to the first axis, the display region including a second type of display pixels each consisting of:
two green subpixels adjacent to each other in one green subpixel row,
one red subpixel included in a subpixel column between subpixel columns each including one of the two green subpixels and in a red subpixel row adjacent to the one green subpixel row, and
one blue subpixel included in the subpixel column between the subpixel columns each including one of the two green subpixels and in a blue subpixel row adjacent to the one green subpixel row,
the one red subpixel and the one blue subpixel being a center on the first axis, the two green subpixels being symmetrically arranged with respect to the second axis, the display region including rows composed of the first type of display pixels disposed along the first axis and rows composed of the second type of display pixels disposed along the first axis being disposed alternately along the second axis, the first type of display pixels adjacent to each other sharing a red subpixel and a blue subpixel and each green subpixel belonging to one first type of display pixel exclusively in each of the rows composed of the first type of display pixels, the second type of display pixels adjacent to each other sharing a green subpixel and each red subpixel and each blue subpixel belonging to one second type of display pixel exclusively in each of the rows composed of the second type of display pixels, wherein the display region consists of (2n+1) subpixel columns each extending along the second axis, where n is a natural number, and the control method comprising:
determining a luminance value to be assigned from a first frame pixel to the green subpixel of a corresponding first type of display pixel based on luminance data for the first frame pixel in a predetermined method;
determining a luminance value to be assigned from the first frame pixel to each of the two red subpixels of the first type of display pixel to be a value lower than a luminance value determined for one red subpixel based on the luminance data for the first frame pixel in the predetermined method;
determining a luminance value to be assigned from the first frame pixel to each of the two blue subpixels of the first type of display pixel to be a value lower than a luminance value determined based on the luminance data for the first frame pixel for one blue subpixel in the predetermined method;
determining a luminance value to be assigned from a second frame pixel to each of the red subpixel and the blue subpixel of a corresponding second type of display pixel based on luminance data for the second frame pixel in the predetermined method;
determining a luminance value to be assigned from the second frame pixel to each of the two green subpixels of the second type of display pixel to be a value lower than a luminance value determined for one green subpixel based on the luminance data for the second frame pixel in the predetermined method;
determining luminance values to be assigned to the red subpixel and the blue subpixel shared between the first type of display pixels adjacent to each other based on luminance values to be assigned in both of the first type of display pixels adjacent to each other; and determining a luminance value to be assigned to the green subpixel shared between the second type of display pixels adjacent to each other based on luminance values to be assigned in both of the second type of display pixels adjacent to each other, wherein a number of the frame pixels of the video frame is equal to a total number of the first type of display pixels and the second type of display pixels, and the frame pixels correspond to the first type of display pixels and the second type of display pixels on a one-to-one basis.

7. The control method according to claim 6, further comprising:

determining the luminance value to be assigned from the first frame pixel to each of the two red subpixels of the first type of display pixel to be a half of the luminance value determined for one red subpixel in the predetermined method;

determining the luminance value to be assigned from the first frame pixel to each of the two blue subpixels of the first type of display pixel to be a half of the luminance value determined for one blue subpixel in the predetermined method; and determining the luminance value to be assigned from the second frame pixel to each of the two green subpixels of the second type of display pixel to be a half of the luminance value determined for one green subpixel in the predetermined method.

8. The control method according to claim 6, further comprising determining a luminance value to be assigned from a second frame pixel to the first green subpixel located at either end of a display line to be a value lower than a luminance value to be assigned from the second frame pixel to the other second green subpixel of the same second type of display pixel, wherein the display line is composed of a plurality of consecutive second type of display pixels to be lighted along the first axis.

9. The control method according to claim 6, further comprising:

determining the luminance value to be assigned from the first frame pixel to each of the two red subpixels of the first type of display pixel to be a half of the luminance value determined for one red subpixel in the predetermined method;

determining the luminance value to be assigned from the first frame pixel to each of the two blue subpixels of the first type of display pixel to be a half of the luminance value determined for one blue subpixel in the predetermined method;

determining a luminance value to be assigned from a second frame pixel to the first green subpixel located at either end of a display line composed of a plurality of consecutive second type of display pixels to be lighted along the first axis to be a value lower than a luminance value to be assigned from the second frame pixel to the other second green subpixel of the same second type of display pixel;

determining a luminance value to be assigned from the second frame pixel to the second green subpixel to be a half of a luminance value determined for one green subpixel in the predetermined method; and determining a luminance value to be assigned from another second frame pixel to each of the two green subpixels of a corresponding second type of display pixel located inner than the second type of display pixels located at both ends of the display line to be a half of a luminance value determined for one green subpixel in the predetermined method.

* * * * *